US012635460B2

(12) United States Patent
Kim et al.

(10) Patent No.: US 12,635,460 B2
(45) Date of Patent: *May 19, 2026

(54) SENSOR MODULE AND SUBSTRATE PROCESSING APPARATUS USING THE SAME

(71) Applicant: Samsung Electronics Co., Ltd., Suwon-si (KR)

(72) Inventors: Daejung Kim, Suwon-si (KR); Minyoung Kang, Suwon-si (KR); Sungsoo Kim, Suwon-si (KR); Sohee Kim, Suwon-si (KR); Yongsoo Yoo, Suwon-si (KR); Jihyeon Ha, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 560 days.

This patent is subject to a terminal disclaimer.

(21) Appl. No.: 18/162,182

(22) Filed: Jan. 31, 2023

(65) Prior Publication Data

US 2024/0014060 A1     Jan. 11, 2024

(30) Foreign Application Priority Data

Jul. 5, 2022     (KR) ........................ 10-2022-0082344

(51) Int. Cl.
*H10P 72/30* (2026.01)
*B25J 9/16* (2006.01)
(Continued)

(52) U.S. Cl.
CPC ............ *H10P 72/33* (2026.01); *B25J 9/1697* (2013.01); *G01B 21/24* (2013.01); *G01D 5/24* (2013.01);
(Continued)

(58) Field of Classification Search
None
See application file for complete search history.

(56) References Cited

U.S. PATENT DOCUMENTS 7,286,218 B2    10/2007  Tiemeyer et al.
7,440,086 B2    10/2008  Borowicz et al.
(Continued)

FOREIGN PATENT DOCUMENTS

KR          20190041321 A      4/2019
KR          102059716 B1     12/2019
(Continued)

OTHER PUBLICATIONS

English Machine Translation of Kim et al. (KR20220062186A) retrieved from Espacenet Sep. 15, 2025 (Year: 2025).*
(Continued)

*Primary Examiner* — Ram N Kackar
*Assistant Examiner* — Laureen Chan
(74) *Attorney, Agent, or Firm* — Wolf, Greenfield & Sacks, P.C.

(57) ABSTRACT

A sensor module includes a body including a first body part and a second body part detachably coupled to the first body part, a first sensor unit on a lower surface of the body, and configured to detect a contact area in which the lower surface of the body contacts a first external object and to output a first measurement value, a second sensor unit on a side surface of the body and configured to output a second measurement value by measuring a distance between the side surface of the body and a second external object, and a control circuit in the body part configured to control the first sensor unit and the second sensor unit and generate measurement data based on the first measurement value and the second measurement value. The first sensor unit and the second sensor unit are in the second body part.

12 Claims, 21 Drawing Sheets

(51) Int. Cl.

| | |
|---|---|
| *G01B 21/24* | (2006.01) |
| *G01D 5/24* | (2006.01) |
| *G06T 7/00* | (2017.01) |
| *G06T 7/73* | (2017.01) |
| *H01J 37/32* | (2006.01) |
| *H10F 39/00* | (2025.01) |
| *H10P 72/50* | (2026.01) |
| *H10P 72/76* | (2026.01) |

(52) U.S. Cl.

CPC ............... *G06T 7/001* (2013.01); *G06T 7/74* (2017.01); *H01J 37/32715* (2013.01); *H10F 39/804* (2025.01); *H10P 72/53* (2026.01); *G06T 2207/30148* (2013.01); *H01J 2237/2007* (2013.01); *H01J 2237/24578* (2013.01); *H01J 2237/334* (2013.01); *H10P 72/7602* (2026.01)

(56) References Cited

U.S. PATENT DOCUMENTS

| | | | |
|---|---|---|---|
| 7,505,125 | B2 | 3/2009 | Andrews et al. |
| 7,531,984 | B2 | 5/2009 | Freed et al. |
| 7,557,910 | B2 | 7/2009 | Baran et al. |
| 7,605,913 | B2 | 10/2009 | Bills et al. |
| 7,623,227 | B2 | 11/2009 | Judell et al. |
| 7,659,974 | B2 | 2/2010 | Bills et al. |
| 7,839,495 | B2 | 11/2010 | Baran et al. |
| 7,855,549 | B2 | 12/2010 | Renken et al. |
| 8,041,103 | B2 | 10/2011 | Kulkarni et al. |
| 8,059,268 | B2 | 11/2011 | Judell et al. |
| 8,104,342 | B2 | 1/2012 | Sun et al. |
| 8,165,384 | B1 | 4/2012 | Ma et al. |
| 8,330,947 | B2 | 12/2012 | Bills et al. |
| 8,497,984 | B2 | 7/2013 | Bills et al. |
| 8,537,350 | B2 | 9/2013 | Bills et al. |
| 8,553,215 | B2 | 10/2013 | Bills et al. |
| 8,731,718 | B2 | 5/2014 | Rodnick |
| 9,002,497 | B2 | 4/2015 | Volk et al. |
| 9,103,800 | B2 | 8/2015 | Bills et al. |
| 9,110,033 | B2 | 8/2015 | Bills et al. |
| 9,184,084 | B2 | 11/2015 | Rodnick |
| 9,214,333 | B1 | 12/2015 | Sims et al. |
| 9,263,350 | B2 | 2/2016 | Kapoor et al. |
| 9,335,248 | B1 | 5/2016 | Taylor |
| 9,349,629 | B2 | 5/2016 | Blank et al. |
| 9,353,439 | B2 | 5/2016 | Kashyap et al. |
| 9,378,971 | B1 | 6/2016 | Briggs et al. |
| 9,384,998 | B2 | 7/2016 | Hudson et al. |
| 9,428,833 | B1 | 8/2016 | Duvall et al. |
| 9,434,071 | B2 | 9/2016 | Rodnick |
| 9,508,547 | B1 | 11/2016 | Pasquale et al. |
| 9,518,930 | B2 | 12/2016 | Judell et al. |
| 9,528,942 | B2 | 12/2016 | Bills et al. |
| 9,543,158 | B2 | 1/2017 | Hudson et al. |
| 9,558,928 | B2 | 1/2017 | Thedjoisworo et al. |
| 9,564,312 | B2 | 2/2017 | Henri et al. |
| 9,588,441 | B2 | 3/2017 | Macnaughton et al. |
| 9,589,790 | B2 | 3/2017 | Henri et al. |
| 9,596,744 | B2 | 3/2017 | Leeser |
| 9,617,638 | B2 | 4/2017 | Lavoie et al. |
| 9,624,578 | B2 | 4/2017 | Qian et al. |
| 9,677,190 | B2 | 6/2017 | Kim et al. |
| 9,685,320 | B2 | 6/2017 | Kang et al. |
| 9,689,083 | B2 | 6/2017 | Brogan et al. |
| 9,698,042 | B1 | 7/2017 | Baldasseroni et al. |
| 9,732,434 | B2 | 8/2017 | Buckalew |
| 9,735,035 | B1 | 8/2017 | Ranjan et al. |
| 9,738,977 | B1 | 8/2017 | Karim et al. |
| 9,773,643 | B1 | 9/2017 | Singhal et al. |
| 9,777,386 | B2 | 10/2017 | Doubina et al. |
| 9,797,042 | B2 | 10/2017 | Nowak et al. |
| 9,822,460 | B2 | 11/2017 | Dinneen et al. |
| 9,831,110 | B2 | 11/2017 | Francken et al. |
| 9,840,776 | B2 | 12/2017 | Kapoor et al. |
| 9,851,643 | B2 | 12/2017 | Chilese et al. |
| 9,875,891 | B2 | 1/2018 | Henri et al. |
| 9,881,820 | B2 | 1/2018 | Wong et al. |
| 9,887,097 | B2 | 2/2018 | Hudson |
| 9,892,956 | B1 | 2/2018 | Konkola et al. |
| 9,911,595 | B1 | 3/2018 | Smith et al. |
| 9,915,625 | B2 | 3/2018 | Gao et al. |
| 9,945,044 | B2 | 4/2018 | Dinneen et al. |
| 9,953,843 | B2 | 4/2018 | Shen et al. |
| 9,960,068 | B1 | 5/2018 | Konkola et al. |
| 9,966,290 | B2 | 5/2018 | Senn |
| 9,997,357 | B2 | 6/2018 | Arghavani et al. |
| 9,997,371 | B1 | 6/2018 | Agarwal et al. |
| 9,997,372 | B2 | 6/2018 | Briggs et al. |
| 9,997,373 | B2 | 6/2018 | Hudson |
| 10,011,917 | B2 | 7/2018 | He et al. |
| 10,012,599 | B2 | 7/2018 | Wells et al. |
| 10,018,572 | B2 | 7/2018 | Bills et al. |
| 10,020,220 | B2 | 7/2018 | Konkola et al. |
| 10,037,884 | B2 | 7/2018 | Ou et al. |
| 10,043,656 | B1 | 8/2018 | Smith et al. |
| 10,043,690 | B2 | 8/2018 | Kapoor et al. |
| 10,047,438 | B2 | 8/2018 | Dhas et al. |
| 10,062,563 | B2 | 8/2018 | Kumar et al. |
| 10,062,589 | B2 | 8/2018 | Wong et al. |
| 10,062,590 | B2 | 8/2018 | Wong et al. |
| 10,062,599 | B2 | 8/2018 | Genetti et al. |
| 10,074,543 | B2 | 9/2018 | Mahorowala et al. |
| 10,094,035 | B1 | 10/2018 | Graham et al. |
| 10,094,038 | B2 | 10/2018 | Thorum et al. |
| 10,121,689 | B2 | 11/2018 | Konkola et al. |
| 10,124,492 | B2 | 11/2018 | Genetti et al. |
| 10,134,579 | B2 | 11/2018 | Baldasseroni et al. |
| 10,145,010 | B2 | 12/2018 | Kapoor et al. |
| 10,155,309 | B1 | 12/2018 | Blank |
| 10,157,736 | B2 | 12/2018 | Van Schravendijk et al. |
| 10,176,984 | B2 | 1/2019 | Smith et al. |
| 10,181,185 | B2 | 1/2019 | Park et al. |
| 10,190,232 | B2 | 1/2019 | Buckalew et al. |
| 10,190,865 | B2 | 1/2019 | Aguilar Amaya et al. |
| 10,196,753 | B2 | 2/2019 | Dinneen et al. |
| 10,197,908 | B2 | 2/2019 | Sriraman et al. |
| 10,199,212 | B2 | 2/2019 | Smith et al. |
| 10,202,691 | B2 | 2/2019 | Karim et al. |
| 10,214,828 | B2 | 2/2019 | He et al. |
| 10,214,829 | B2 | 2/2019 | He et al. |
| 10,242,866 | B2 | 3/2019 | Smith et al. |
| 10,254,641 | B2 | 4/2019 | Mailfert et al. |
| 10,297,459 | B2 | 5/2019 | Hudson et al. |
| 10,304,693 | B2 | 5/2019 | Hudson |
| 10,304,717 | B2 | 5/2019 | Genetti et al. |
| 10,329,683 | B2 | 6/2019 | Brogan et al. |
| 10,340,136 | B1 | 7/2019 | Agnew et al. |
| 10,354,909 | B2 | 7/2019 | Konkola et al. |
| 10,358,738 | B2 | 7/2019 | Ma et al. |
| 10,373,806 | B2 | 8/2019 | Singhal et al. |
| 10,373,840 | B2 | 8/2019 | Hudson et al. |
| 10,378,107 | B2 | 8/2019 | Chandrasekharan et al. |
| 10,407,773 | B2 | 9/2019 | Lavoie et al. |
| 10,407,794 | B2 | 9/2019 | Dinneen et al. |
| 10,416,092 | B2 | 9/2019 | Arora et al. |
| 10,427,307 | B2 | 10/2019 | Genetti et al. |
| 10,443,146 | B2 | 10/2019 | Huang et al. |
| 10,460,930 | B2 | 10/2019 | Hausmann et al. |
| 10,490,413 | B2 | 11/2019 | Smith et al. |
| 10,494,715 | B2 | 12/2019 | Agarwal et al. |
| 10,497,592 | B2 | 12/2019 | Ranjan et al. |
| 10,508,351 | B2 | 12/2019 | Joi et al. |
| 10,508,359 | B2 | 12/2019 | Brogan et al. |
| 10,509,052 | B2 | 12/2019 | Thaulad et al. |
| 10,526,701 | B2 | 1/2020 | Kumar et al. |
| 10,534,257 | B2 | 1/2020 | Tetiker et al. |
| 10,559,468 | B2 | 2/2020 | Arghavani et al. |
| 10,566,186 | B2 | 2/2020 | Van Schravendijk et al. |
| 10,566,216 | B2 | 2/2020 | Senn et al. |
| 10,570,515 | B2 | 2/2020 | Konkola et al. |
| 10,573,549 | B2 | 2/2020 | Konkola et al. |
| 10,577,691 | B2 | 3/2020 | Nowak et al. |
| 10,585,347 | B2 | 3/2020 | Sriraman et al. |

(56) References Cited

U.S. PATENT DOCUMENTS

| | | | |
|---|---|---|---|
| 10,629,429 | B2 | 4/2020 | Smith et al. |
| 10,629,435 | B2 | 4/2020 | Swaminathan et al. |
| 10,655,240 | B2 | 5/2020 | Banik et al. |
| 10,669,644 | B2 | 6/2020 | Dinneen et al. |
| 10,679,848 | B2 | 6/2020 | Kumar et al. |
| 10,689,774 | B2 | 6/2020 | He et al. |
| 10,692,717 | B2 | 6/2020 | Agnew et al. |
| 10,692,735 | B2 | 6/2020 | Thorkelsson et al. |
| 10,697,059 | B2 | 6/2020 | Phillips et al. |
| 10,699,937 | B2 | 6/2020 | Konkola et al. |
| 10,704,149 | B2 | 7/2020 | Dhas et al. |
| 10,711,364 | B2 | 7/2020 | Dinneen et al. |
| 10,713,771 | B2 | 7/2020 | Marella et al. |
| 10,741,365 | B2 | 8/2020 | Chandrasekharan et al. |
| 10,741,440 | B2 | 8/2020 | Dordi et al. |
| 10,760,178 | B2 | 9/2020 | Banik et al. |
| 10,763,107 | B2 | 9/2020 | Van Schravendijk et al. |
| 10,763,108 | B2 | 9/2020 | Hausmann et al. |
| 10,770,339 | B2 | 9/2020 | Genetti et al. |
| 10,774,438 | B2 | 9/2020 | Thorum et al. |
| 10,777,407 | B2 | 9/2020 | Smith et al. |
| 10,781,527 | B2 | 9/2020 | Banik et al. |
| 10,804,099 | B2 | 10/2020 | Henri et al. |
| 10,825,679 | B2 | 11/2020 | Hausmann et al. |
| 10,832,908 | B2 | 11/2020 | Lavoie |
| 10,870,922 | B2 | 12/2020 | Konkola et al. |
| 10,879,092 | B2 | 12/2020 | Kapoor et al. |
| 10,896,821 | B2 | 1/2021 | Liu |
| 10,903,070 | B2 | 1/2021 | Liu et al. |
| 10,903,071 | B2 | 1/2021 | Smith et al. |
| 10,927,475 | B2 | 2/2021 | He et al. |
| 10,954,604 | B2 | 3/2021 | Buckalew |
| 10,957,514 | B2 | 3/2021 | Singhal et al. |
| 10,975,489 | B2 | 4/2021 | Fortner et al. |
| 10,989,652 | B2 | 4/2021 | Feng et al. |
| 11,011,379 | B2 | 5/2021 | Arghavani et al. |
| 11,056,366 | B2 | 7/2021 | Bieli et al. |
| 11,056,380 | B2 | 7/2021 | Konkola et al. |
| 11,078,591 | B2 | 8/2021 | Brogan et al. |
| 11,112,773 | B2 | 9/2021 | Trussell et al. |
| 2003/0202092 | A1* | 10/2003 | Sadighi ................. B25J 9/1697 |
| | | | 348/87 |
| 2009/0056441 | A1 | 3/2009 | Sun et al. |
| 2014/0355643 | A1 | 12/2014 | Sharratt et al. |
| 2019/0113324 | A1 | 4/2019 | Hwang et al. |
| 2019/0237351 | A1* | 8/2019 | Krupyshev ....... H01L 21/67742 |
| 2020/0072594 | A1 | 3/2020 | Potter et al. |
| 2020/0075367 | A1 | 3/2020 | Potter et al. |
| 2020/0075368 | A1 | 3/2020 | Potter et al. |
| 2020/0075369 | A1 | 3/2020 | Potter et al. |
| 2020/0103294 | A1 | 4/2020 | Potter et al. |
| 2020/0411390 | A1* | 12/2020 | Yang ................ H01L 21/68735 |
| 2021/0013074 | A1* | 1/2021 | Lee ........................ G01B 11/25 |
| 2021/0035831 | A1* | 2/2021 | Arakane .......... H01L 21/68707 |
| 2022/0254666 | A1* | 8/2022 | Sadeghi ........... H01L 21/67778 |

FOREIGN PATENT DOCUMENTS

| | | | | |
|---|---|---|---|---|
| KR | 20210000089 | A | 1/2021 | |
| KR | 20210041873 | A * | 4/2021 | ....... H01L 21/67259 |
| KR | 20220062186 | A * | 5/2022 | ....... H01L 21/67259 |

OTHER PUBLICATIONS

English Machine Translation of Jeong et al. (KR20210041873A) retrieved from Espacenet Sep. 15, 2025 (Year: 2025).*

\* cited by examiner

420

RF_IMG1

IMG1

A

IMG2

RF_IMG2

IMG3

SENSOR MODULE AND SUBSTRATE PROCESSING APPARATUS USING THE SAME

CROSS-REFERENCE TO RELATED APPLICATION(S)

This application claims the benefit under 35 USC 119(a) of Korean Patent Application No. 10-2022-0082344, filed on Jul. 5, 2022 in the Korean Intellectual Property Office, the disclosure of which is incorporated herein by reference in its entirety.

BACKGROUND

The present inventive concept relates to a sensor module and a substrate processing apparatus using the same.

Semiconductor devices are widely used in the electronics industry due to characteristics such as miniaturization, multifunctionality, and/or low manufacturing costs. Semiconductor devices may be manufactured by various manufacturing processes such as a photolithography process, an etching process, a deposition process, an ion implantation process, and a cleaning process.

In general, such manufacturing processes are respectively performed sequentially in different processing modules, and the substrate is transferred between different processing modules by a transfer unit such as a transfer robot. If the substrate is not disposed in place in a chamber by the transfer unit, a process of correcting the reference position of the transfer unit is necessary, and to this end, there may be a problem in which the equipment should be stopped.

SUMMARY

Example embodiments provide a sensor module capable of seating a substrate on a target position in a processing module without interruption of equipment, and a substrate processing apparatus using the same.

According to example embodiments, a sensor module includes a body including a first body part and a second body part detachably coupled to the first body part, the first body part and the second body part being coupled to each other to have an outer shape of a semiconductor wafer; a first sensor unit on a lower surface of the body and configured to detect a region or contact area in which the lower surface of the body contacts a first external object and to output a first measurement value; a second sensor unit on a side surface of the body and configured to output a second measurement value by measuring a distance between the side surface of the body and a second external object; and a control circuit in the body configured to control the first sensor unit and the second sensor unit and generate measurement data based on the first measurement value and the second measurement value. The first sensor unit and the second sensor unit are in the second body part.

According to example embodiments, a substrate processing apparatus includes a chamber defining an internal space in which processing a substrate is performed; an electrostatic chuck inside the chamber and including a loading area surrounded by a sidewall; a sensor module configured to be loaded into the loading area of the electrostatic chuck and to output measurement data including a first measurement value obtained by detecting an area in contact with the loading area and a second measurement value obtained by detecting a separation distance from the sidewall; a transfer robot configured to load the sensor module onto a reference position of the loading area; and a controller configured to calculate an error value between a center of the sensor module and the reference position based on the first measurement value and the second measurement value output from the sensor module.

According to example embodiments, a substrate processing apparatus includes a chamber including an internal space in which a substrate processing process of a substrate is performed; a substrate support unit in the internal space and including a loading area on which a lower surface of the substrate is configured to be seated and a mechanism is disposed and which is surrounded by a sidewall; an imaging unit configured to generate first measurement data by imaging the lower surface of the substrate on which the substrate processing process has been performed; a sensor module configured to be carried into the internal space and seated in the loading area, and configured to output second measurement data including a first measurement value obtained by detecting an area in contact with the loading area and a second measurement value obtained by detecting a separation distance from the sidewall; a transfer robot configured to load and unload the sensor module and the substrate into and from the internal space; and a control unit configured to identify particle patterns of which an arrangement of the mechanism is transferred and an edge of the substrate in a process of performing the substrate processing process in the first measurement data, to calculate a first alignment error value that is a deviation between a rough center of the loading area and a center of the substrate based on or from the particle patterns and the edge of the substrate, respectively, to determine a point in time at which the sensor module should be brought into the internal space based on the first alignment error value, to detect an edge of the loading area based on or from the second measurement data, to calculate a second alignment error value of the substrate by comparing the edge of the loading area with a reference position value, and to calibrate or teach the transfer robot to correct the second alignment error value.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, example embodiments will be described with reference to the accompanying drawings.

Figure 1:
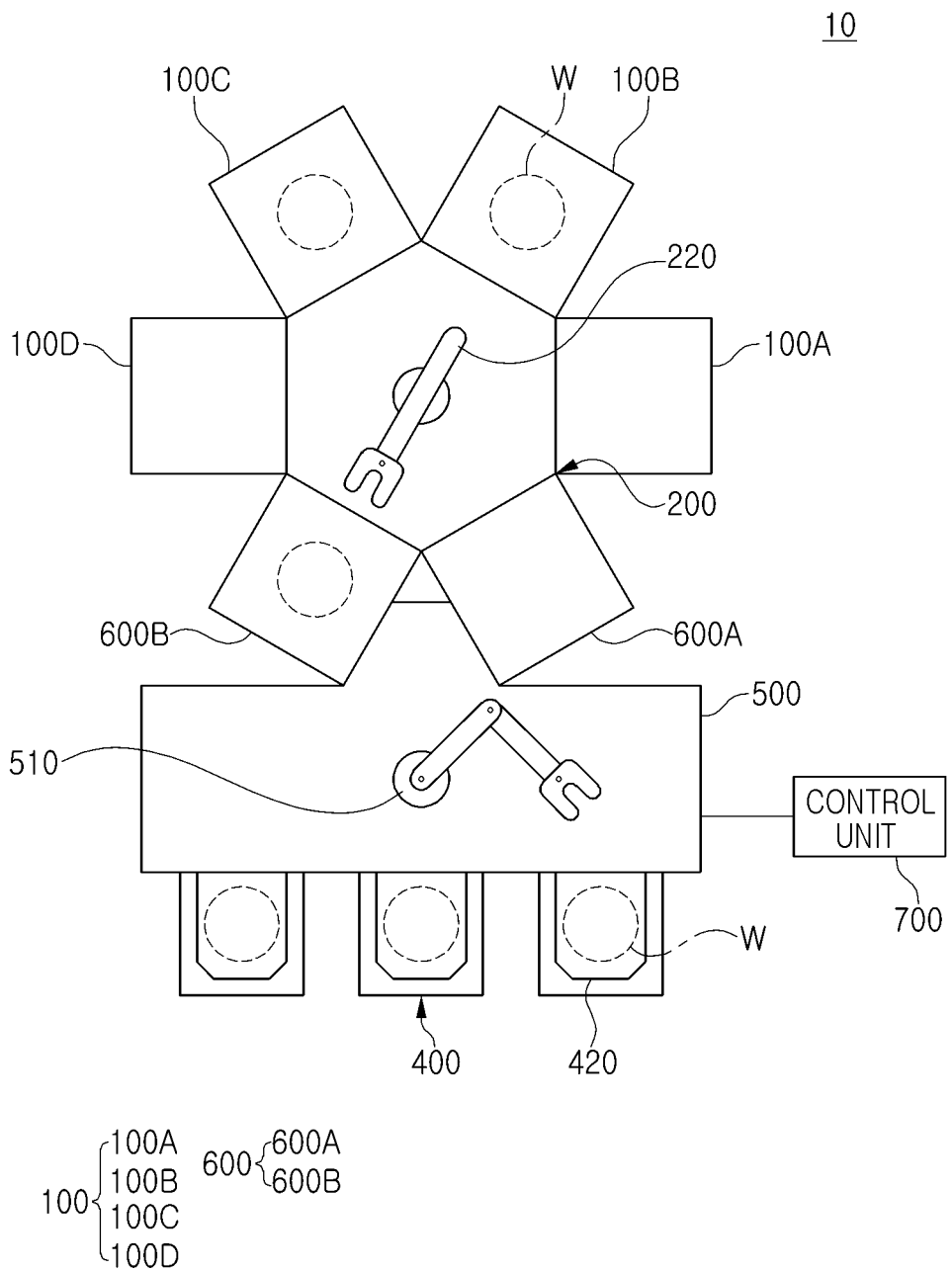
FIG. 1 is a schematic plan view of a substrate processing apparatus according to an example embodiment.
Figure 2:
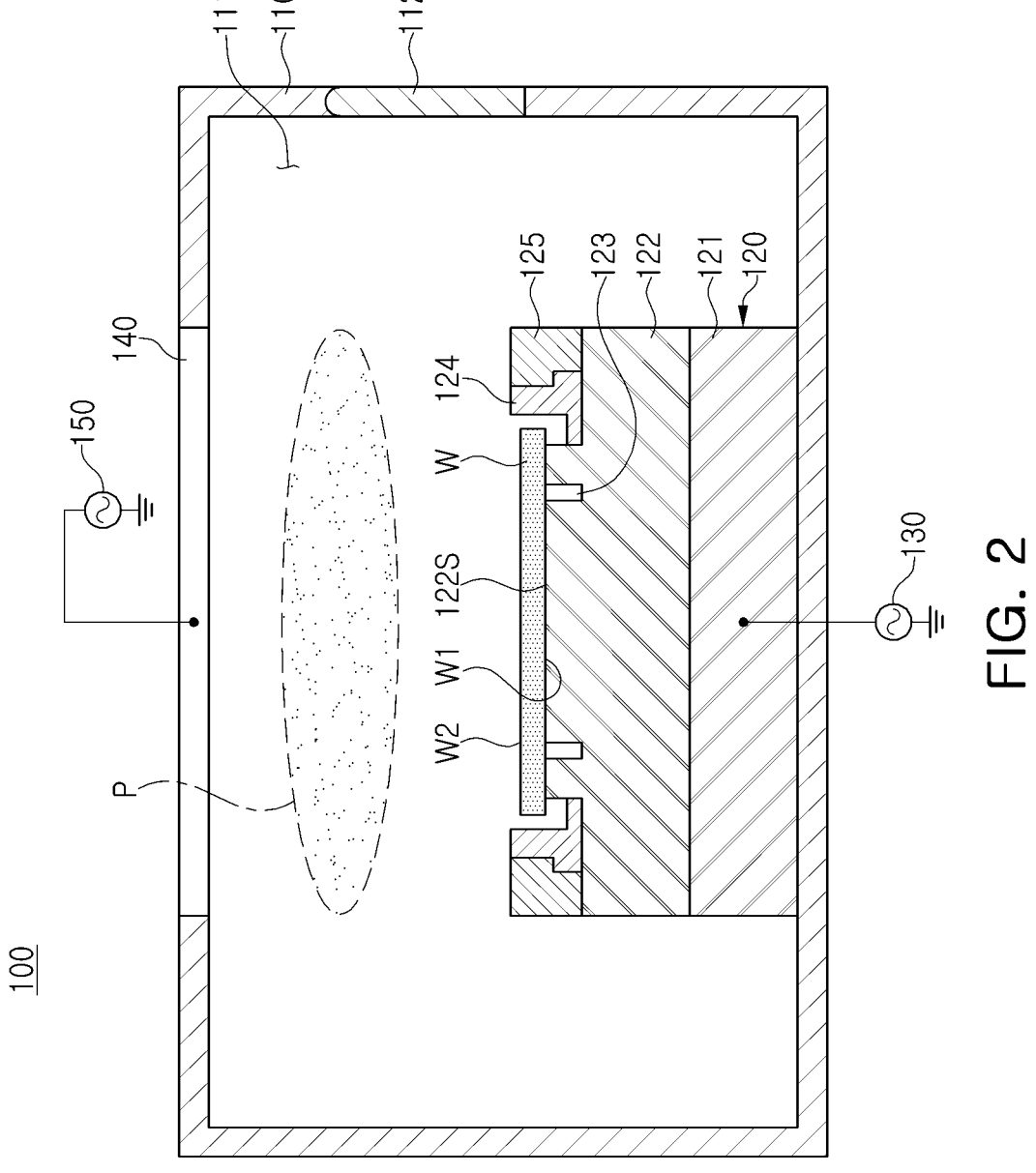
FIG. 2 is a side view of a processing module of FIG. 1.
Figure 3:
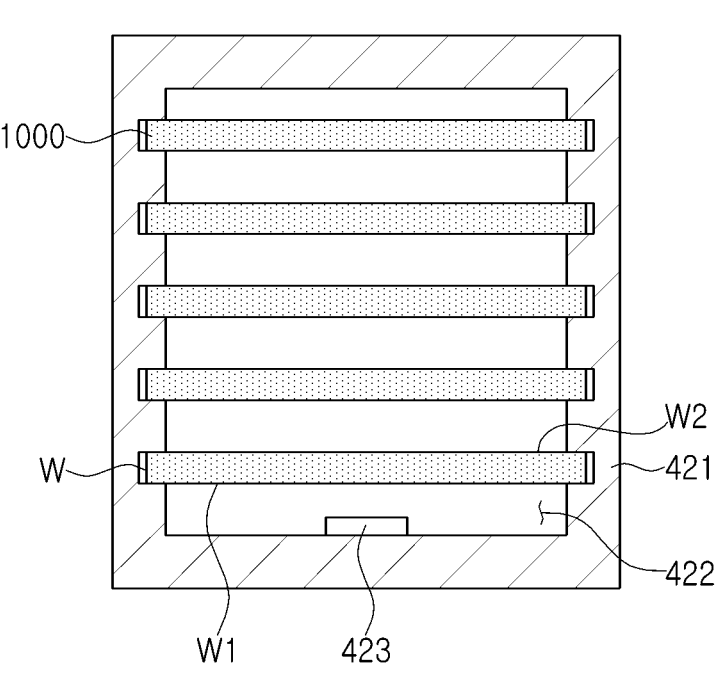
FIG. 3 is a side view of a transfer container of FIG. 1.

A substrate processing apparatus according to an example embodiment will be described with reference to FIGS. 1 to 3. FIG. 1 is a schematic plan view of a substrate processing apparatus according to an example embodiment. FIG. 2 is a side view of a processing module of FIG. 1, and FIG. 3 is a side view of a transfer container of FIG. 1.

Referring to FIG. 1, a substrate processing apparatus 10 according to an example embodiment may be used to perform an etching process for etching a film on a substrate W such as a semiconductor wafer used in manufacturing a semiconductor device. However, the present inventive concept is not limited thereto, and may be applied to various processes requiring correction of misalignment of the substrate W.

The substrate processing apparatus 10 may include a processing module 100 for processing the substrate W, a substrate transfer module 200, a loading port 400, an interface module 500, a load lock chamber 600, and a control unit or controller 700.

The processing module 100 may perform a predetermined process on the substrate W. For example, the processing module 100 may perform processes such as chemical vapor deposition, etching, photo or photolithography, and cleaning processes. According to an example embodiment, a case in which an etching process is performed in the processing module 100 will be described as an example. In addition, according to an example embodiment, a plurality of processing modules 100 may be disposed around one substrate transfer module 200. However, the quantity of the process-ing module(s) 100 may be variously changed according to the processing amount of the substrate W.

Referring to FIG. 2, the processing module 100 may include a chamber 110 having a reaction space formed by a side wall, an upper electrode 140 disposed in an upper portion of the chamber 110, and an electrostatic chuck 120 disposed in a lower portion of the chamber 110 to face the upper electrode 140 and supporting the substrate W. The processing module 100 according to an example embodiment may include first to fourth processing modules 100A, 100B, 100C, and 100D, but the inventive concept is not limited thereto.

The electrostatic chuck 120 may include a base body 121 functioning as a lower electrode, a plate 122 attached to the upper surface of the base body 121 and including an electrode therein, a focus ring 124 disposed on the plate 122, and an insulation ring 125 surrounding focus ring 124. An upper surface 122S of the plate 122 may be provided as a loading area on which the substrate W is seated, on which a mechanism or support such as a lift fin 123 may be disposed. Hereinafter, the loading area, the upper surface 122S of the plate 122, and the upper surface of the electrostatic chuck 120 may be used interchangeably.

The upper electrode 140 may be disposed in an upper portion of the chamber 110 to face the electrostatic chuck 120. The upper electrode 140 may be or include a shower-head that distributes a process gas into the chamber 110. The showerhead may spray the process gas on the surface of the substrate W.

The electrostatic chuck 120 may receive power from a first power source 130, and the upper electrode 140 may receive power from a second power source 150. The electrostatic chuck 120 and the upper electrode 140 may be synchronized to form an electric field. The process gas supplied to an internal space 111 of the chamber 110 may be excited by plasma P through this electric field.

At least one processing module 100 may be disposed around the substrate transfer module 200, and a transfer robot 220 as a transfer device for loading and unloading the substrate W into/from the processing module 100 may be disposed therein.

The load lock chamber 600 may be located between the interface module 500 and the substrate transfer module 200, and may be provided to temporarily accommodate the substrate W to be loaded into the processing module 100 for the process and the substrate W on which the process has been completed. The load lock chamber 600 may alternately maintain an atmospheric pressure state and a vacuum state. The load lock chamber 600 according to an example embodiment may include a first load lock chamber 600A and a second load lock chamber 600B, but the inventive concept is not limited thereto.

The loading port 400 may support a transfer container 420 in which a plurality of substrates W are accommodated, and the interface module 500 may include an interface robot 510 for transferring the substrate W accommodated in the trans-fer container 420 to the processing module 100 and trans-ferring the substrate W having been processed by the pro-cessing module 100 back into the transfer container 420. As an example, as illustrated, the substrate processing apparatus 10 may include a plurality of the loading ports 400.

The control unit 700 may be provided to control the overall operation of the substrate processing apparatus 10, and may be implemented by a processor such as, for example, Central Processing Unit (CPU), Graphics Process-ing Unit (GPU), Microprocessor, Application Specific Inte-grated Circuit (ASIC), Field Programmable Gate Arrays (FPGA), or the like. In addition, the control unit 700 may be provided with a memory for storing various data necessary for the operation of the substrate processing apparatus 10, and a database to be described below may be stored in advance in the memory.

Referring to FIGS. 1 and 3, the transfer container 420 may load a plurality of substrates W and a sensor module 1000 in an internal space 422, and at least one of the plurality of substrates W may be loaded in the lowermost portion of the transfer container 420. The transfer container 420 may be a sealed transfer container having a door such that external air does not flow into the transfer container 420. For example, the transport container 420 may be a Front Opening Unified Pod (FOUP). The transfer container 420 may be used to transport the substrate W, which has been processed in the substrate processing apparatus 10, to another substrate processing apparatus 10.

An imaging unit or imaging system 423 for acquiring an image of a lower surface W1 of the substrate W may be disposed on the lower surface of the internal space 422. Hereinafter, the lower surface W1 of the substrate W may be the backside of the substrate W. According to an example embodiment, the imaging unit 423 may be disposed in a separate measurement facility in the process of transporting the transport container 420 rather than the lower part of the transport container 420. For example, the imaging unit 423 may include a charge coupled device (CCD) camera or a complementary metal-oxide semiconductor (CMOS) camera. The imaging unit 423 may transmit data of an image obtained by capturing the lower surface W1 of the substrate W to the control unit 700. The control unit 700 may control the imaging unit 423 of the transfer container 420 to image all of the lower surfaces W1 of the substrates W included in each transfer container 420, and according to an example embodiment, the control unit 700 may control the imaging unit 423 to image the lower surfaces W1 of the substrates W included in some transfer containers 420.

An upper surface W2 of the substrate W loaded in the transfer container 420 may be understood as a surface processed by the processing module 100, and the lower surface W1 of the substrate W may be understood as a surface seated on a substrate support unit such as the electrostatic chuck 120. In the substrate processing process, particles may be attached to the lower surface W1 of the substrate W, and the particles may be attached to a position corresponding to a position in which a mechanism in which the substrate W is installed in the loading area is disposed, thereby forming a pattern. In an example embodiment, the mechanism means that a plurality of mechanisms are exposed to the loading area, to be used as a reference point for identifying the center of the loading area. For example, the mechanism may be a lift fin 123, and a pattern formed of particles may be formed on the lower surface W1 of the substrate W to correspond to a position where the lift fin 123 is disposed.

In this manner, since the position where the mechanism of the loading area is disposed is transferred to the pattern formed by the particles attached to the lower surface W1 of the substrate W, the center of the loading area may be calculated by analyzing the pattern of the particles. In an example embodiment, a pattern of particles may be formed on the lower surface W1 of the substrate W to correspond to the position where the lift fins 123 disposed on the upper surface 122S of the plate 122 are disposed.

In general, the transfer robot 220 loads the substrate W such that the center of the processing module 100 and the center of the substrate W coincide. However, as the operating time of the transfer robot 220 increases, the deviation between the center of the upper surface 122S of the plate 122 of the processing module 100 and the center of the substrate W tends to gradually increase. To reduce the deviation, teaching (e.g., adjusting or calibrating) is being performed to reset the position at which the transfer robot 220 loads the substrate W into the processing module 100. However, since it is necessary to stop the operation of the substrate processing apparatus 10 to perform the teaching, when teaching is performed, there is a problem in that the substrate throughput per unit time is reduced, thereby increasing production costs.

Figure 6:
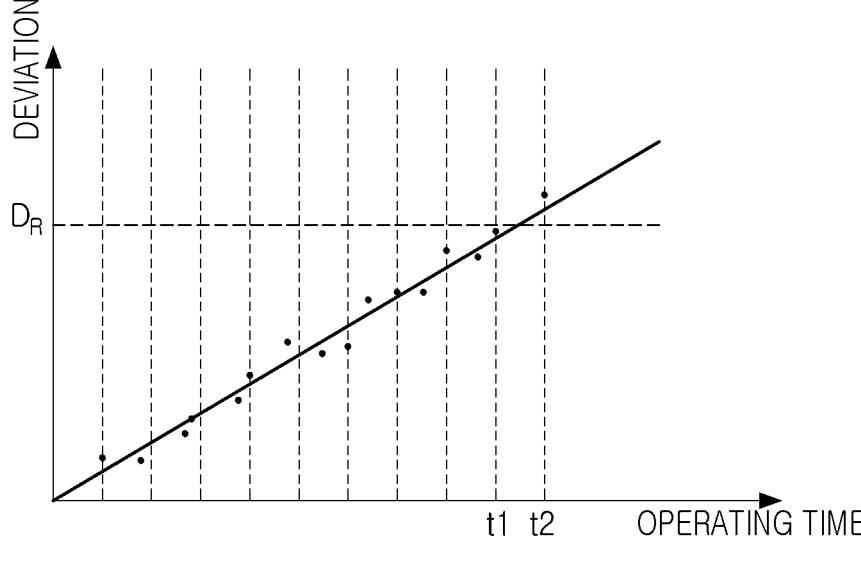
FIG. 6 is a diagram illustrating a correlation between an operating time of a substrate processing apparatus and a deviation of the center.

Referring to FIG. 6, the substrate processing apparatus 10 according to an example embodiment predicts a point in time t2 at which the deviation value between the center of the substrate W and the center of the upper surface 122S of the plate 122 exceeds a reference value DR, based on a first image IMG1 obtained by imaging the lower surface W1 of the substrate W, and may load the sensor module 1000 onto the plate 122 and may precisely measure the degree of misalignment of the substrate W, before a point in time exceeding the reference value is reached (t1). However, the present inventive concept is not limited thereto, and at the time when the calculated deviation of the center and the reference position is expected to exceed the reference value, teaching for correcting the deviation value may be directly performed without bringing in the sensor module 1000. When the sensor module 1000 is seated in the loading area and the reference position at which the transfer robot 220 mounts the substrate is calculated based on the captured image, the transfer robot 220 may be taught with high precision, and there is an advantage in that teaching may be performed without stopping the substrate processing apparatus 10. However, since the sensor module 1000 is loaded into the processing module 100 by replacing the substrate W processed by the processing module 100, the throughput of the substrate W processed by the processing module 100 is reduced. Therefore, to significantly reduce the decrease in the throughput of the substrate W, the sensor module 1000 should be carried into the processing module 100 only at a time when teaching is required. For example, in the case of an example embodiment, since the point in time at which the sensor module 1000 is to be carried in may be determined, based on the image provided by imaging the lower surface W1 of the substrate W, the reduction in the throughput of the substrate W may be significantly reduced without stopping the substrate processing apparatus 10.

In addition, the lower surface W1 of the substrate W may be imaged before discharging the substrate W from the transfer container 420 to be processed in the processing module 100 and after the substrate W is processed in the processing module 100. The control unit 700 may determine whether the substrate W is seated in the target position, based on an image (hereinafter referred to as a 'first reference image (RF_IMG1)') captured before being processed by the processing module 100 and an image (hereinafter referred to as a 'first image (IMG1)') captured after being processed. This will be described with reference to FIGS. 4A and 4B.

Figure 4A:
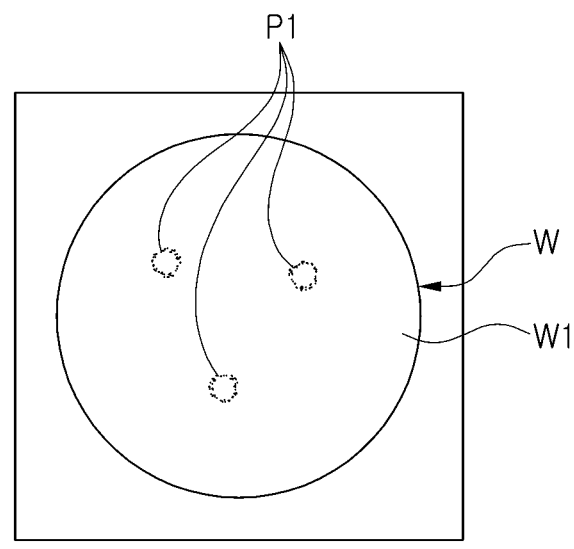
FIG. 4A is an image of a lower surface of a substrate, captured before the substrate is loaded into a processing module.
Figure 4B:
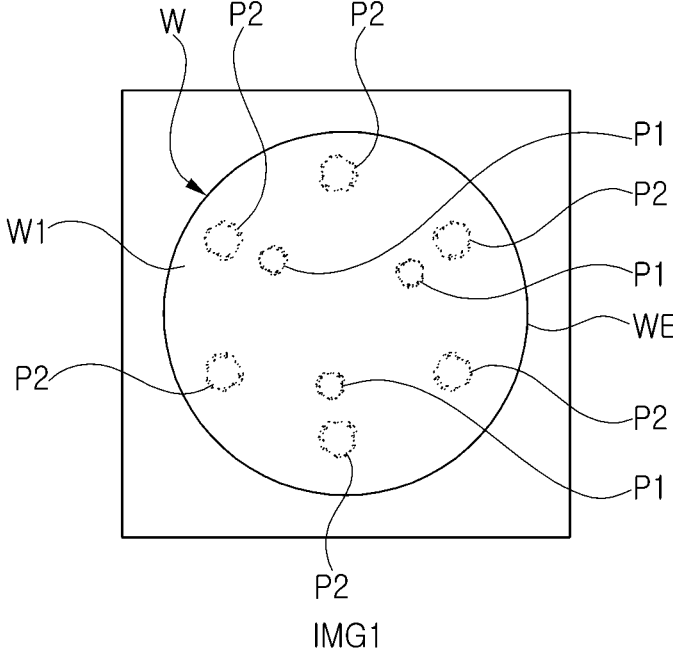
FIG. 4B is a lower surface image of the substrate captured after the substrate is loaded into the processing module and a substrate processing process is performed.

FIG. 4A is the first reference image RF_IMG1 obtained by capturing the lower surface W1 of the substrate W before the substrate W is loaded into the processing module 100. It may be understood that first patterns P1 formed on the lower surface W1 of the substrate W are attached in a facility in which a substrate processing process of a previous step is performed. FIG. 4B is the first image IMG1 of the lower surface of the substrate captured after the substrate W is loaded into the processing module 100 and the substrate processing process is performed. It may be understood that second patterns P2 formed on the lower surface W1 of the substrate W are attached while the substrate processing process is performed in the processing module 100. The control unit 700 may identify the first patterns P1 in the first reference image RF_IMG1, and identify the first patterns P1 and the second patterns P2 in the first image IMG1. The control unit 700 identifies the first patterns P1 as a common pattern and removes the first patterns P1 from the first image IMG1, thereby calculating the center positions of the second patterns P2 excluding the first patterns P1 formed in the facility of the previous step. Since the second patterns P2 correspond to the positions of the mechanisms disposed on the electrostatic chuck 120 disposed in the processing module 100 in which the processing process has been performed, the center of the electrostatic chuck 120 may be roughly calculated by calculating the center of the second patterns P2.

However, according to an example embodiment, the first reference image RF_IMG1 may not be captured. The location information of the first patterns P1 formed in the facility of the previous stage is stored in a database in advance, and the control unit 700 may identify the second patterns P2 in the first image IMG1 with reference to the database.

In addition, the control unit 700 may identify an edge WE of the substrate W from the first image IMG1, and may calculate the center of the substrate W from the edge WE of the substrate W. The control unit 700 may check whether the substrate W is being loaded at a target position of the electrostatic chuck 120 from the calculated centers of the second patterns P2 and the substrate W. A process in which the control unit 700 determines whether the substrate W is being loaded at a target position of the electrostatic chuck 120 will be described with reference to FIG. 5.

Figure 5:
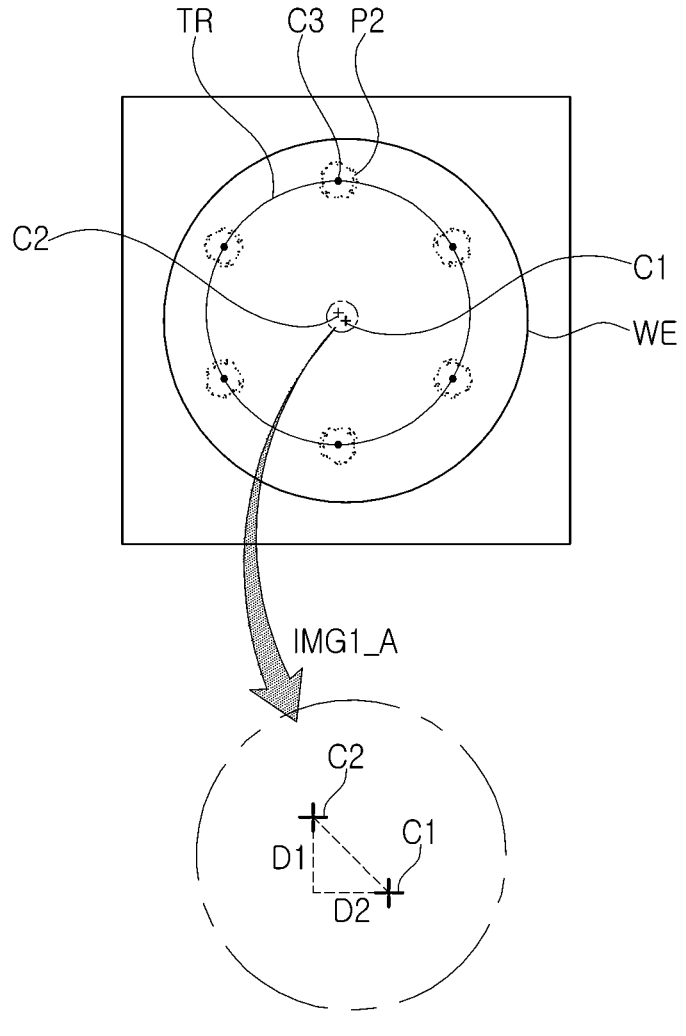
FIG. 5 is a view illustrating a process of identifying the center of a substrate based on the lower surface image of FIG. 4B.

FIG. 5 is a diagram illustrating a corrected image IMG1_A on which image processing of deleting the first patterns P1 from the first image IMG1 of FIG. 4B is performed. The control unit 700 may identify respective centers C3 of the second patterns P2 formed on the lower surface of the substrate W, and calculate a trace TR connecting the centers C3. The control unit 700 may calculate a center C2 of the trace TR. The center C2 of the trace TR schematically represents the center of the electrostatic chuck 120, and may be used as a reference value for calculating a deviation value from the center C1 of the substrate W. For example, the control unit 700 may compare the center C2 of the trace TR with the center C1 of the substrate W, and calculate deviation values D1 and D2. The calculated deviation values D1 and D2 may be used as data for determining whether to bring the sensor module 1000 into the processing module 100. For example, when the deviation values D1 and D2 are within the allowable error range, the control unit 700 may withhold loading of the sensor module 1000 into the processing module 100. On the other hand, when the deviation values D1 and D2 exceed the allowable error range, the control unit 700 may bring the sensor module 1000 into the processing module 100 to calculate a more accurate deviation value.

Figure 7:
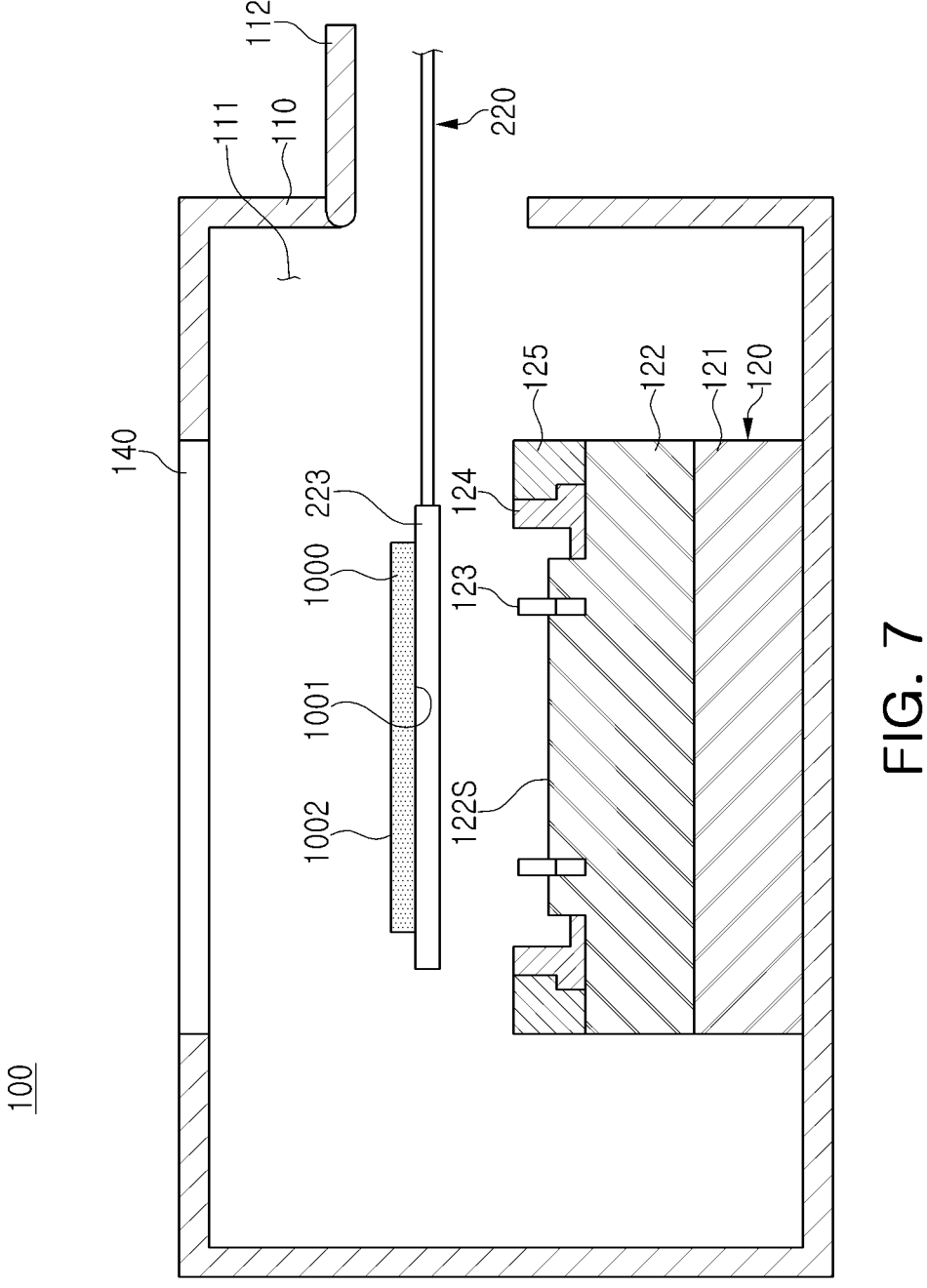
FIG. 7 is a diagram illustrating a process of loading a sensor module into the processing module of FIG. 2.
Figure 8:
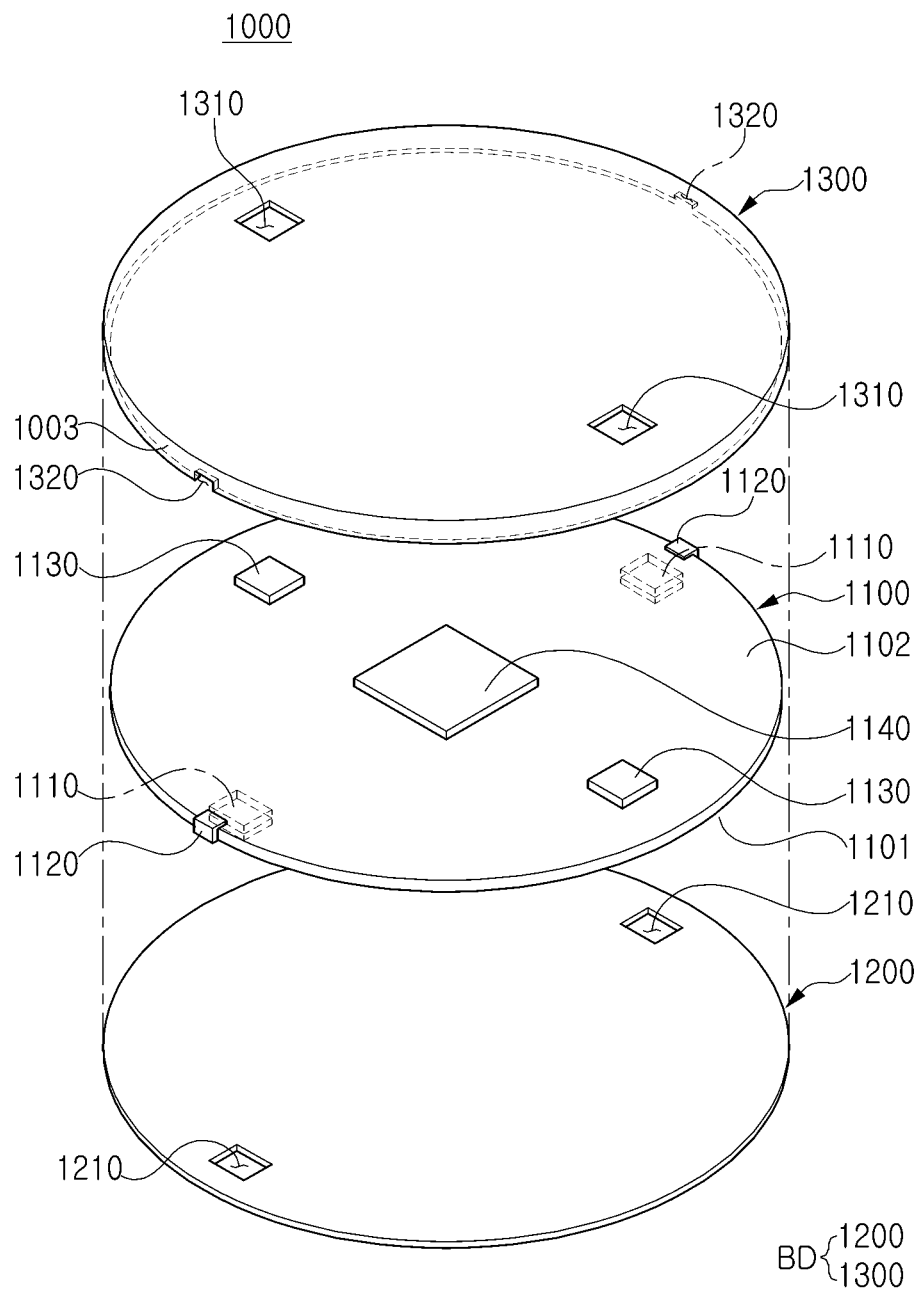
FIG. 8 is an exploded perspective view of a sensor module.
Figure 9:
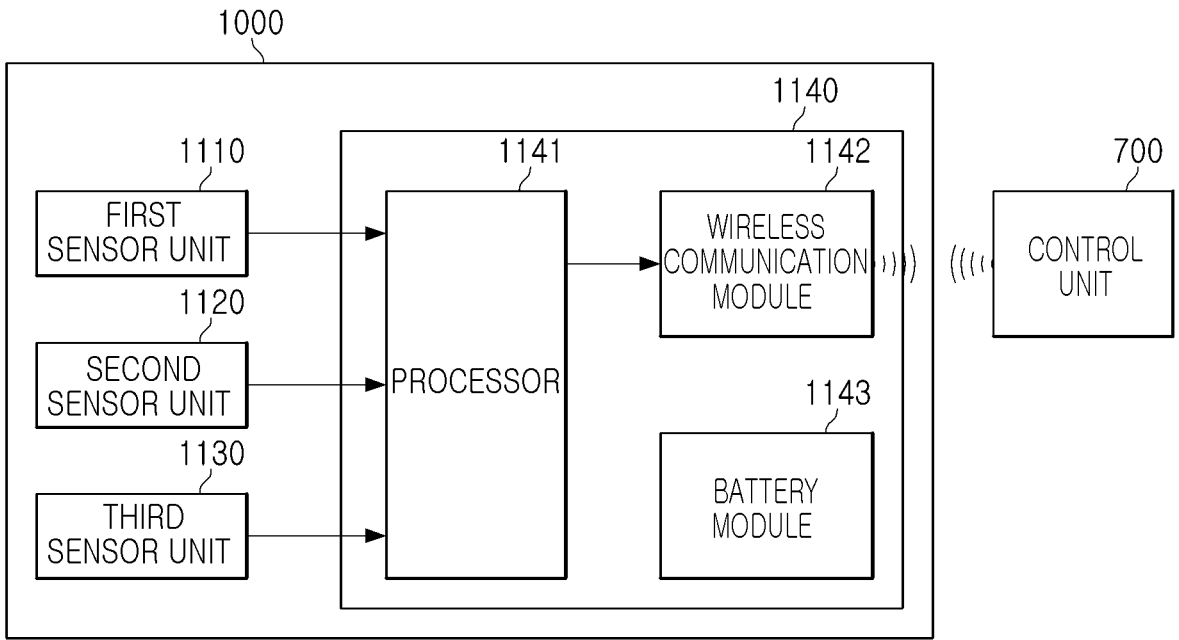
FIG. 9 is a block diagram of a sensor module.
Figure 10:
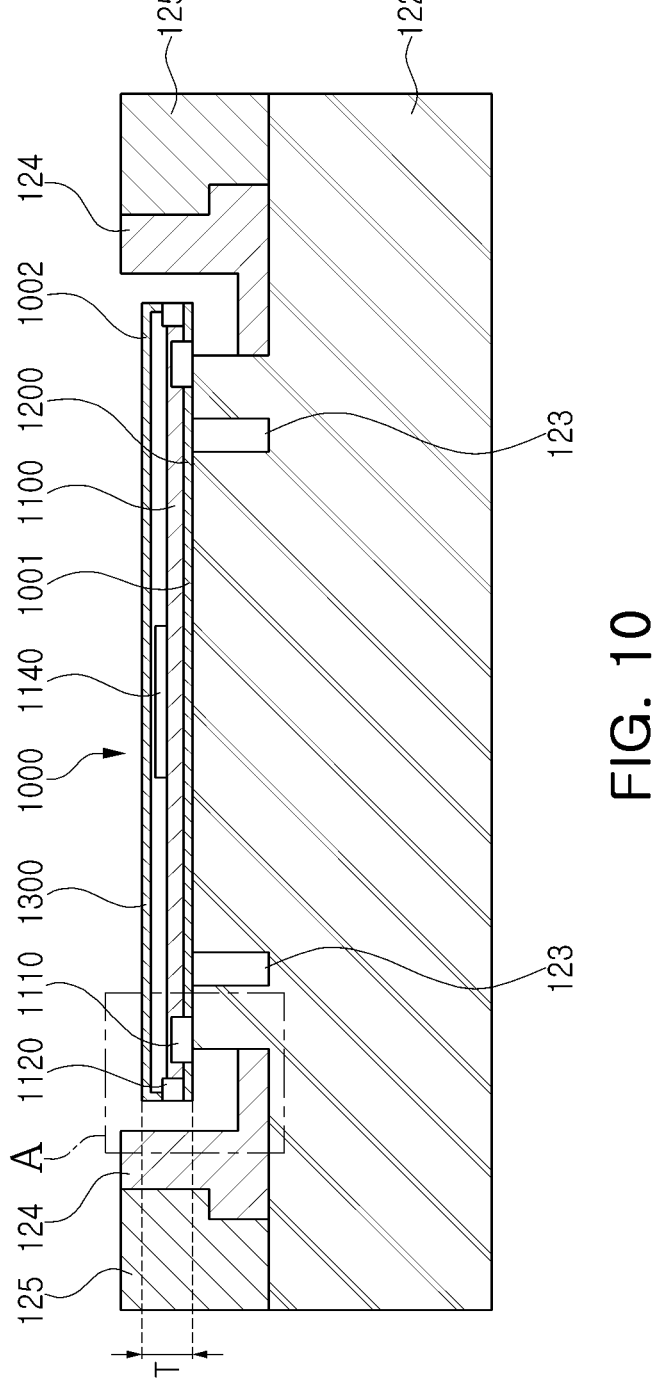
FIG. 10 is a diagram illustrating a state in which the sensor module is seated on an electrostatic chuck.
Figure 11:
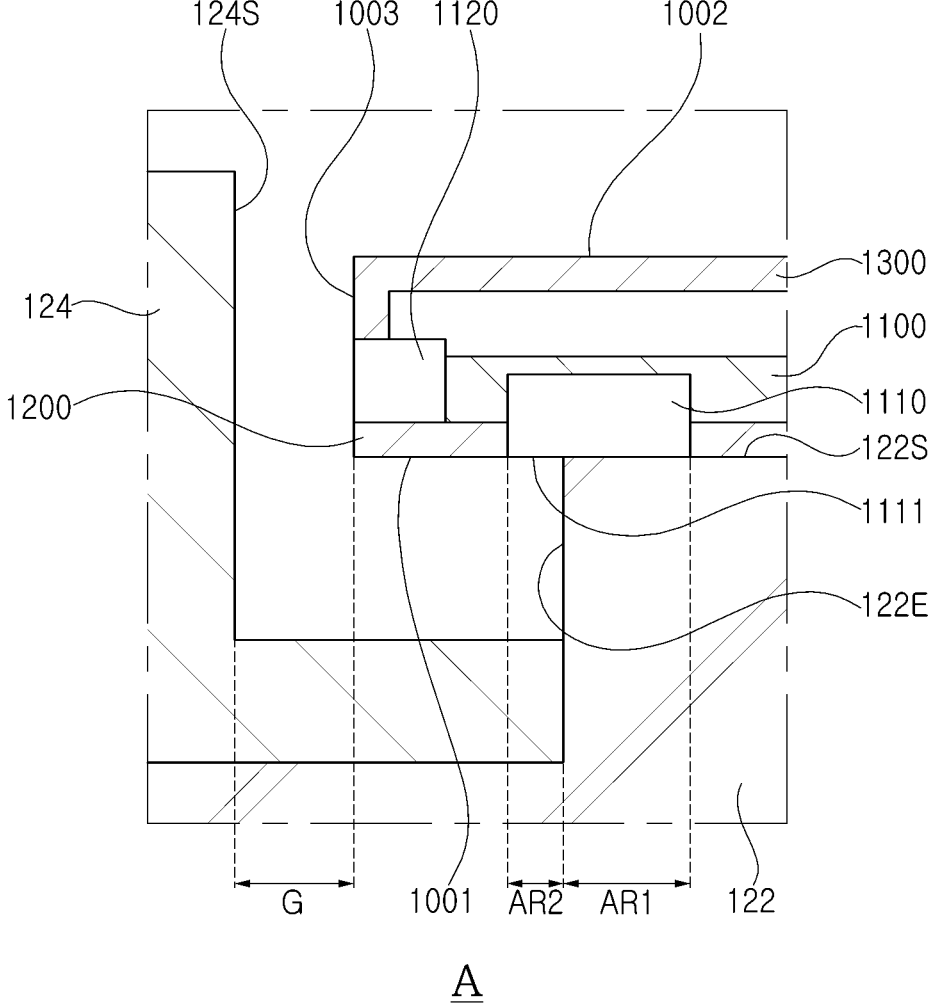
FIG. 11 is an enlarged view of part A of FIG. 10.
Figure 12:
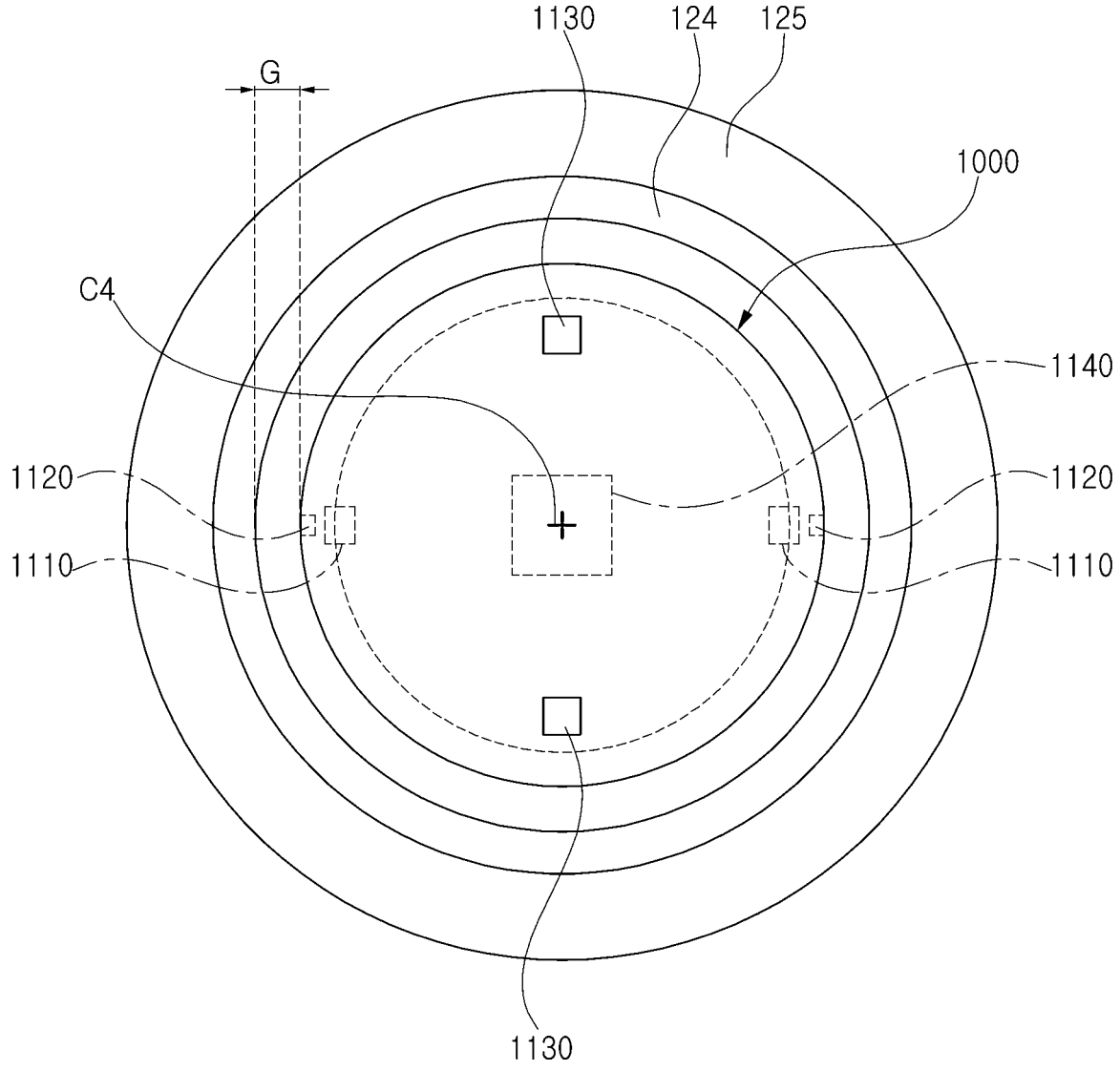
FIG. 12 is a plan view of the electrostatic chuck of FIG. 10 as viewed from above.
Figure 13A:
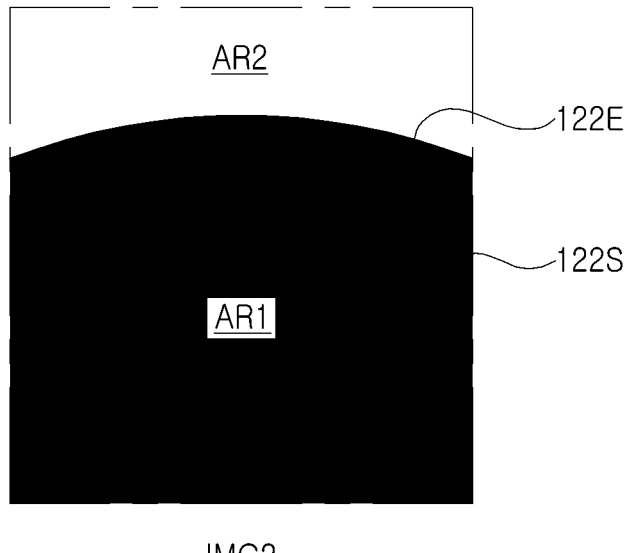
FIG. 13A is an image of an upper surface of a plate captured by a first sensor unit of FIG. 12.
Figure 13B:
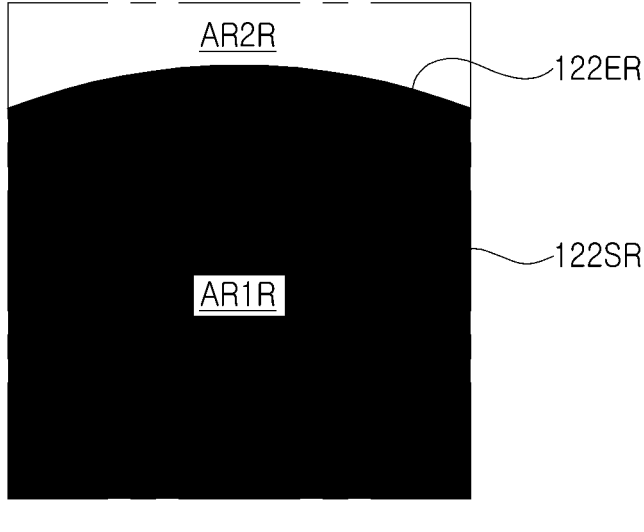
FIG. 13B is a reference image of the upper surface of the plate.
Figure 14:
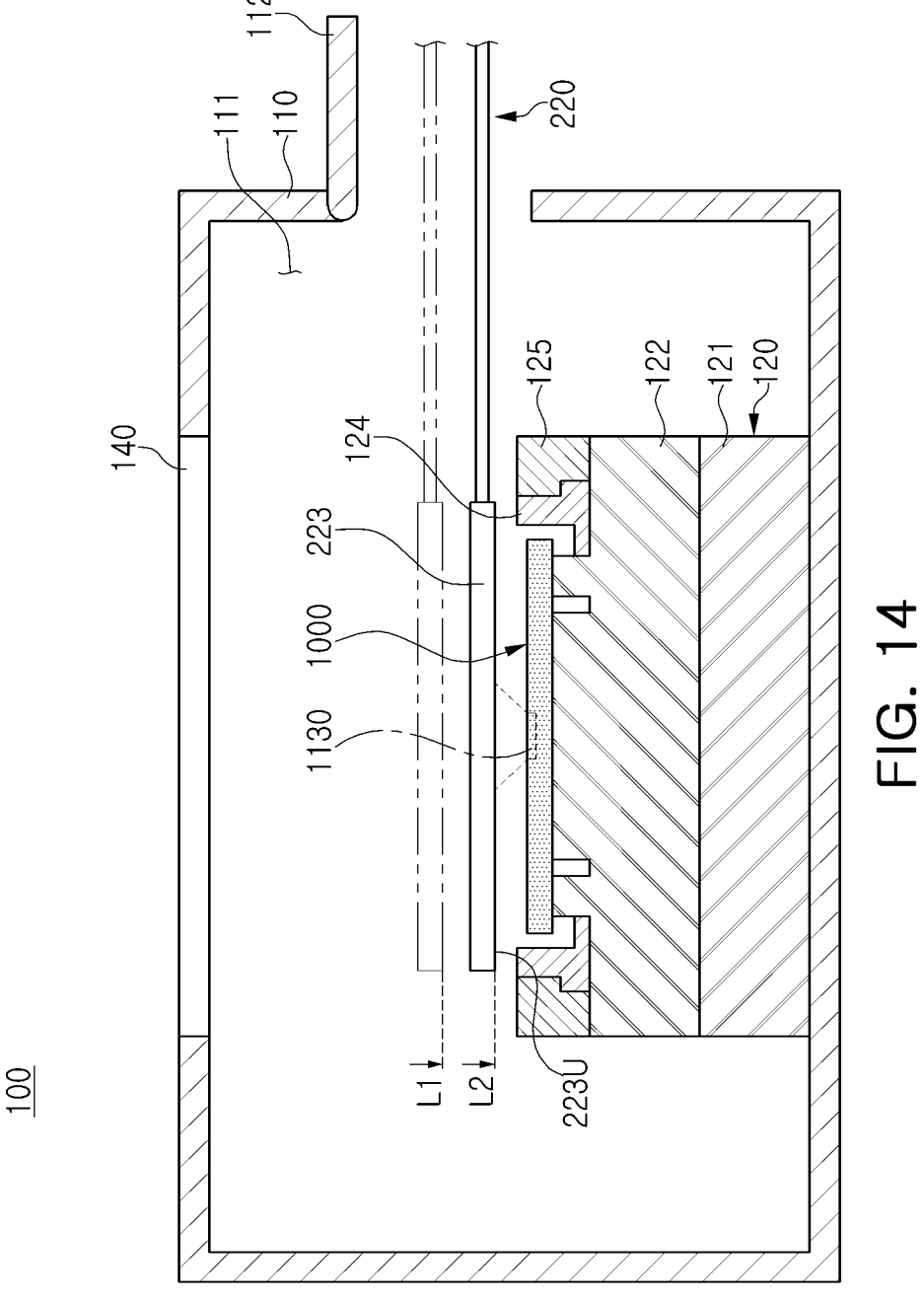
FIG. 14 is a diagram illustrating a process of capturing an image of a lower surface of a hand of a transfer robot using a second sensor unit of a sensor module.
Figures 15A, 15B:
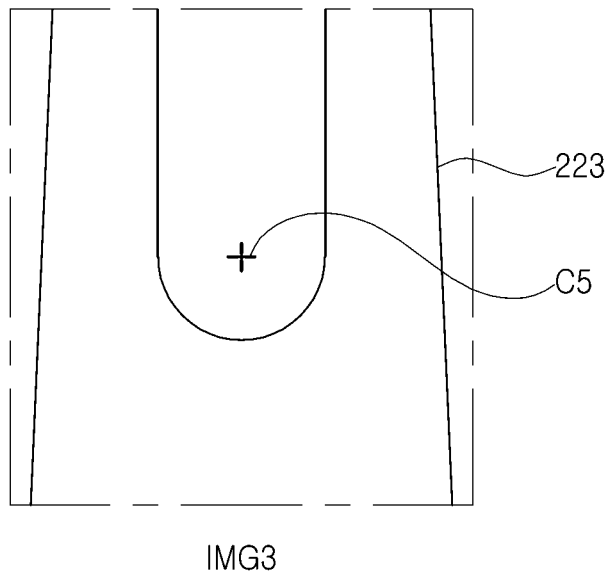
FIG. 15A is an image of the hand captured by the second sensor unit.
FIG. 15B is a diagram illustrating a process of identifying the center of the hand using the image of FIG. 15A.

The sensor module 1000 will be described with reference to FIGS. 7 to 15B. FIG. 7 is a diagram illustrating a process of loading a sensor module into the processing module of FIG. 2, and FIG. 8 is an exploded perspective view of a sensor module. FIG. 9 is a block diagram of a sensor module. FIG. 10 is a view illustrating a state in which the sensor module is seated on the electrostatic chuck, and FIG. 11 is an enlarged view of part A of FIG. 10. FIG. 12 is a plan view viewed from above of the electrostatic chuck of FIG. 10, FIG. 13A is a top image of the electrostatic chuck captured by a lower sensor of FIG. 12, and FIG. 13B is a reference image of the electrostatic chuck. FIG. 14 is a diagram illustrating a process of capturing an image of a lower surface of a hand using an upper sensor of a sensor module. FIG. 15A is an image of the hand captured by the upper sensor, and FIG. 15B is a view illustrating a process of identifying the center of the hand using the image of FIG. 15A.

Referring to FIG. 7, the sensor module 1000 may be loaded on a hand 223 of the transfer robot 220 and loaded into the internal space 111 through the door 112 of the chamber 110. The sensor module 1000 carried into the internal space 111 is supported by the lift fins 123 protruding on the upper surface 122S of the plate 122 and then lowered, and may be seated on the upper surface 122S of the plate 122 providing the loading area. The sensor module 1000 is a measuring device for precisely measuring a deviation value between the center of the substrate W and the center of the electrostatic chuck 120. The sensor module 1000 may have a lower surface 1001 seated on the upper surface 122S of the plate 122 and an upper surface 1002 opposite to the lower surface 1001.

Referring to FIG. 8, the sensor module 1000 may include a body part or body BD and a plurality of sensor units or sensor sets 1110, 1120, and 1130.

The body part BD may include a first cover plate 1200 and a second cover plate 1300, and a circuit board 1100 including the plurality of sensor units 1110, 1120, and 1130 may be disposed between the first cover plate 1200 and the second cover plate 1300. According to an example embodiment, at least one of the first cover plate 1200 and the second cover plate 1300 may be replaced with a coating layer. The body part BD may have a shape similar to the outer shape of the semiconductor wafer (e.g., circular or disk-shaped), and may have a thickness equal to or thinner than the thickness of the semiconductor wafer, and accordingly, may be applied to a process of processing the substrate W while the structure of the substrate processing apparatus 10 described above is maintained as it is. The body part BD may have the lower surface 1001, the upper surface 1002, and a side surface 1003, surrounding the circuit board 1100. Depending on the example embodiment, the side surface 1003 may be omitted. A plurality of holes 1210, 1310, and 1320 through which the plurality of sensor units 1110, 1120, and 1130 are exposed may be formed in the body part BD. A thickness T of the sensor module 1000 may be the same as the thickness of the semiconductor wafer, and may be less than the thickness of the semiconductor wafer (see FIG. 10). For example, the thickness T of the sensor module 1000 may be about 5 mm or less.

Referring to FIGS. 8 and 9, the circuit board 1100 may include a circuit unit or control circuit 1140 for controlling the plurality of sensor units 1110, 1120, and 1130. The circuit unit 1140 may be embedded in the body part BD. The circuit unit 1140 may be disposed in the central portion of the circuit board 1100, but the present inventive concept is not limited thereto. The circuit unit 1140 may include a processor 1141 for processing various data, a wireless communication module 1142 that transmits various data processed by the processor 1141 to an external device such as the control unit 700 and transmits various data provided from the external device to the processor 1141, and a battery module or battery 1143 for supplying power to the circuit unit 1140. The processor 1141, the wireless communication module 1142, and the battery module 1143 may be coupled to each other through a data bus. The processor 1141 may receive a measurement value from the plurality of sensor units 1110, 1120 and 1130, and generate measurement data based on the received measurement value. The wireless communication module 1142 may transmit the measurement data generated by the processor 1141 to the control unit 700.

A first cover plate 1200 may form the lower surface 1001 of the sensor module 1000, and a second cover plate 1300 may form the upper surface 1002 of the sensor module 1000. The first cover plate 1200 and the second cover plate 1300 may have a disk shape, and may be formed of a material with minimal deformation even at high heat, such as polyether ether ketone (PEEK) and quartz.

The plurality of sensor units 1110, 1120, and 1130 will be described with reference to FIGS. 8, 10, 11 and 12.

Referring to FIG. 8, the plurality of sensor units 1110, 1120, and 1130 may include a first sensor unit 1110, a second sensor unit 1120, and a third sensor unit 1130. According to an example embodiment, the third sensor unit 1130 may be omitted. The plurality of sensor units 1110, 1120, and 1130 may be exposed through the plurality of holes 1210, 1310, and 1320 formed in the body part BD.

Referring to FIGS. 8, 10, and 11, the first sensor unit 1110 may detect the upper surface 122S of the plate 122 on which the sensor module 1000 is seated through the plurality of holes 1210 formed in the first cover plate 1200 of the body part BD. The lower surface 1111 of the first sensor unit 1110 may be disposed to be coplanar with the lower surface 1001 of the body part BD. Accordingly, the lower surface of the first sensor unit 1110 may directly contact the upper surface 122S of the plate 122. The first sensor unit 1110 may be disposed downwardly on or below the lower surface 1101 of the circuit board 1100. The first sensor unit 1110 may be disposed adjacent to an edge of the lower surface 1101 of the circuit board 1100. Accordingly, in the first sensor unit 1110, a measurement value obtained by detecting the first area AR1 in contact with the upper surface 122S of the plate 122 and the second area AR2 not in contact with the upper surface 122S of the plate 122 may be transmitted to the circuit unit 1140 (see FIG. 11). The circuit unit 1140 may generate measurement data based on the measurement value received from the first sensor unit 1110 and transmit the measurement data to the control unit 700. The control unit 700 may identify the boundary between a first area AR1 and a second area AR2 by identifying the first area AR1 and the second area AR2 based on the measurement data. Also, the control unit 700 may calculate the center C4 of the plate 122 based on the identified boundary.

Referring to FIG. 12, in the case of the first sensor unit 1110, two or more first sensor units 1110 may be disposed at equal intervals. In an example embodiment, a case in which the two first sensor units 1110 are disposed to form an interior angle of 180° with respect to the center of the circuit board 1100 will be described as an example.

The first sensor unit 1110 may include various types of sensors capable of detecting the upper surface 122S of the plate 122 on which the sensor module 1000 is mounted. For example, the first sensor unit 1110 may include at least one of an image sensor, a capacitive sensor, and an optical sensor.

The image sensor may include a charge coupled device (CCD) camera or a complementary metal-oxide semiconductor (CMOS) camera. The image sensor may capture an image of the upper surface 122S of the plate 122 and transmit the image to the circuit unit 1140. According to an example embodiment, the image sensor may include an optical structure for imaging the upper surface 122S of the plate 122 at an ultra-close distance.

The capacitive sensor may detect a small change in capacitance caused by contact, and detect a change in capacitance of the first area AR1 in contact with the upper surface 122S of the plate 122 and the second area AR2 not in contact with the upper surface 122S of the plate 122. The capacitive sensor may transmit a measured value obtained by sensing a change in capacitance to the circuit unit 1140. This will be described in detail below.

When the first sensor unit 1110 includes the optical sensor, the first sensor unit 1110 irradiates illumination light to the upper surface 122S of the plate 122, and by detecting the reflected light reflected from the upper surface 122S of the plate 122 by the illumination light, the first area AR1 and the second area AR2 may be sensed. This will be described below in detail.

Referring to FIGS. 13A and 13B, based on the measurement data transmitted from the first sensor unit 1110, the process of calculating the center C4 of the upper surface 122S of the plate 122 by the control unit 700 is described. FIG. 13A is an image of the upper surface of the plate captured by the first sensor unit, and FIG. 13B is a reference image of the plate.

As described above, the sensor module 1000 may acquire an image of the upper surface 122S of the plate 122 and transmit the image to the control unit 700. The control unit 700 may calculate the center C4 of the upper surface 122S of the plate 122 based on the image captured by the sensor module 1000. A process of calculating the center C4 of the upper surface 122S of the plate 122 will be described with reference to FIGS. 13A and 13B.

Referring to FIG. 13A, the control unit 700 may identify the first area AR1 in contact with the upper surface 122S of the plate 122 and the second area AR2 not in contact with the upper surface 122S of the plate 122, in the image (hereinafter, referred to as a 'second image IMG2') acquired by the sensor module 1000. The control unit 700 may image-process the second image IMG2 to extract a boundary value between the first area AR1 and the second area AR2. Since the first area AR1 is an area where the first sensor unit 1110 and the upper surface 122S of the plate 122 contact each other, the extracted boundary value indicates an edge 122E of the upper surface 122S of the plate 122. In detail, the control unit 700 may extract the edge 122E of the plate 122 from the second image IMG2. The control unit 700 may calculate a deviation value between the extracted edge 122E and the reference edge 122ER, by comparing the extracted edge 122E with a reference edge 122ER (hereinafter referred to as 'second reference image RF_IMG2') of the reference image stored in advance in the memory. A table for preparing a correlation between the deviation value of the edge and the position of the center C4 of the plate 122 may be previously stored in the memory. The control unit 700 may refer to the table and calculate the center C4 of the plate 122 based on the calculated deviation value.

The control unit 700 may calculate a deviation value between the center C1 of the substrate W and the center C4 of the plate 122 (e.g., the center of the electrostatic chuck) based on the calculated center C4 of the plate 122, and may correct the position in which the transfer robot 220 loads the substrate W on the upper surface 122S of the plate 122 by teaching the transfer robot 220.

The second sensor unit 1120 may measure a gap G between the sensor module 1000 and a sidewall of the electrostatic chuck 120 through the plurality of holes 1320 formed in a side surface of the second cover plate 1300 of the body part BD. According to an example embodiment, the second sensor unit 1120 may measure a gap G of the focus ring 124 with a sidewall 124S (refer to FIG. 11). Referring to FIG. 12, two or more second sensor units 1120 may be disposed at equal intervals. In an example embodiment, a case in which the two second sensor units 1120 are disposed to form an interior angle of 180° with respect to the center of the circuit board 1100 will be described as an example. A side surface of the second sensor unit 1120 may be disposed to be coplanar with the side surface 1003 of the body part BD. The second sensor unit 1120 may be disposed at an edge of the circuit board 1100 and face externally. The second sensor unit 1120 may include various types of distance measuring sensors. For example, the second sensor unit 1120 may include an ultrasonic sensor. The second sensor unit 1120 may transmit a measurement value obtained by sensing the distance from the sidewall of the electrostatic chuck 120 or from the sidewall of the focus ring 124 to the circuit unit 1140.

Referring to FIGS. 8 and 12, the third sensor unit 1130 may capture an upper portion of the sensor module 1000 through the plurality of holes 1310 formed in the second cover plate 1300 of the body part BD. At least one third sensor unit 1130 may be provided. When two or more third sensor units 1130 are provided, the two or more third sensor units 1130 may be disposed at equal intervals. In an example embodiment, a case in which the two third sensor units 1130 are disposed to form an interior angle of 180° with respect to the center of the circuit board 1100 will be described as an example. The third sensor unit 1130 may be disposed on a position in which the center of the hand 223 of the transfer robot 220 carrying in the substrate W is within the angle of view.

The third sensor unit 1130 may include an image sensor. The image sensor may include a charge coupled device (CCD) camera or a complementary metal-oxide semiconductor (CMOS) camera. When the hand 223 of the transfer robot 220 is disposed on the sensor module 1000, the third sensor unit 1130 may transmit an image of the lower surface of the hand 223 to the circuit unit 1140. The circuit unit 1140 may generate measurement data based on the image transmitted from the third sensor unit 1130 and transmit the measurement data to the control unit 700. The control unit 700 may determine whether the hand 223 of the transfer robot 220 is loading the substrate W at a reference position by using the measurement data transmitted from the circuit unit 1140.

An operation of the third sensor unit 1130 will be described with reference to FIGS. 14, 15A and 15B. FIG. 14 is a diagram illustrating a process of capturing an image of the lower surface of the hand using the third sensor unit of the sensor module. FIG. is an image of the hand captured by the third sensor unit, and FIG. 15B is a view illustrating a process of identifying the center of the hand using the image of FIG. 15A.

Referring to FIG. 14, in a state in which the sensor module 1000 is seated on the electrostatic chuck 120, the hand 223 is loaded into the internal space 111 of the chamber 110, and may descend from a height of a first level L1 to a height of a second level L2. The height of the second level L2 indicates a height at which the substrate W carried in by the hand 223 may be supported by the lift fin 123. This process reproduces the movement of the hand 223 in the process in which the substrate W is seated on the upper surface 122S of the plate 122 by the hand 223 of the transfer robot 220. The sensor module 1000 may transmit an image provided by imaging the lower surface 223U of the hand 223 to the control unit 700 while the hand 223 is lowered to the second level L2.

FIG. 15A is an image (hereinafter, referred to as a 'third image IMG3') captured by the third sensor unit 1130 of the sensor module 1000. The control unit 700 may calculate a center C5 of the hand 223 from the third image IMG3. Referring to FIG. the control unit 700 compares the center C5 of the hand 223 calculated from the third image IMG3 with a reference position C6 previously stored in the memory, and may calculate deviation values D3 and D4 between the center C5 of the hand 223 and the reference position C6. The calculated deviation values D3 and D4 may be used to determine whether the hand 223 is loading the substrate W at the reference position. As described above, the control unit 700 may correct the position of the hand 223 by teaching the transfer robot 220, based on the calculated deviation values D3 and D4.

Next, modifications of the sensor module according to an example embodiment will be described. Modifications of the sensor module in an example embodiment will be mainly described with a configuration different from the sensor module 1000 of the above-described embodiment.

Figure 16:
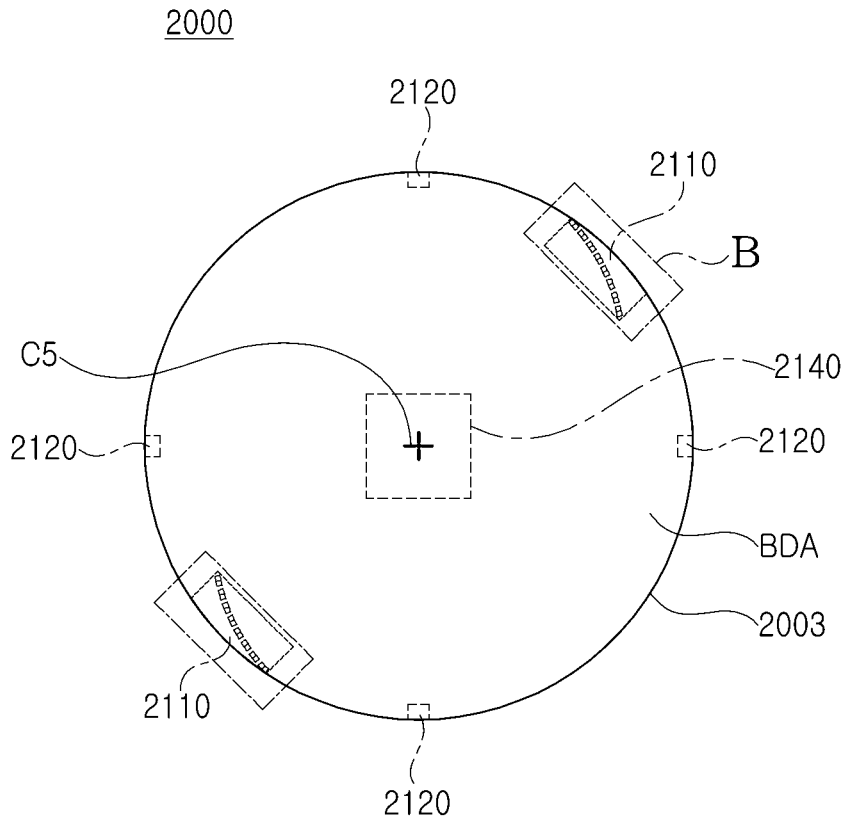
FIG. 16 is a top plan view of a sensor module according to an example embodiment.

A sensor module according to an example embodiment will be described with reference to FIGS. 16 and 17. FIG. 16 is a plan view of a sensor module according to an example embodiment as viewed from above, and FIG. 17 is an enlarged view of part B of FIG. 16.

Figure 17:
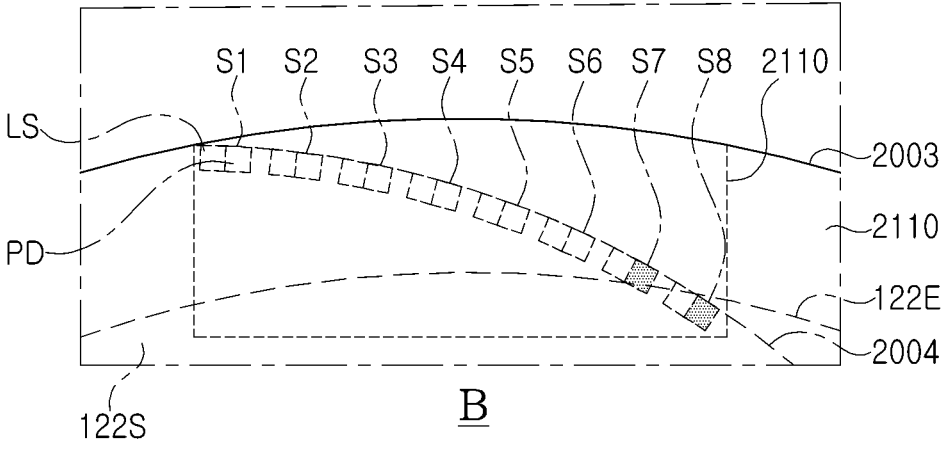
FIG. 17 is an enlarged view of part B of FIG. 16.

Referring to FIGS. 16 and 17, a sensor module 2000 according to an example embodiment may include a body part or body BDA and a plurality of sensor units or sensor sets 2110 and 2120. The plurality of sensor units 2110 and 2120 may include first sensor units 2110 and second sensor units 2120. Similar to the sensor module 1000 of the above-described embodiment, the first sensor units 2110 have a first area in contact with the upper surface 122S of the plate 122, and a second area not in contact with the upper surface 122S of the plate 122. The first sensor units 2110 may be disposed in contact with the upper surface 122S of the plate 122. Also, the second sensor units 2120 may measure a distance between the sensor module 2000 and a sidewall of the electrostatic chuck or the focus ring. A circuit unit or control circuit 2140 may transmit measurement data transmitted from the first sensor units 2110 and the second sensor units 2120 to the control unit 700.

Referring to FIG. 17, the first sensor units 2110 may include a plurality of optical sensors S1, S2, S3, S4, S5, S6, S7, and S8, respectively. In the case of an example embodiment, a case in which the first sensor units 2110 includes eight optical sensors will be described as an example, but the present inventive concept is not limited thereto. The number of optical sensors may be increased or decreased. The plurality of optical sensors S1, S2, S3, S4, S5, S6, S7 and S8 may be disposed in a region corresponding to between an edge 2003 of the body part BDA and an edge 122E of the plate 122, such that separation distances from the edge 2003 of the body part BDA may be sequentially increased. For example, the plurality of optical sensors S1, S2, S3, S4, S5, S6, S7, and S8 may be disposed in a region corresponding to, between the edge 2003 of the body part BDA and the edge 122E of the plate 122, along an imaginary curve 2004 having the same curvature as the edge 122E of the plate 122.

The plurality of optical sensors S1, S2, S3, S4, S5, and S7 may each include a light source unit or light source LS and a light receiving unit or light detector PD. The light source unit LS may radiate illumination light toward the lower surface of the body part BDA. For example, the light source unit LS may be a light emitting device. The light receiving unit PD may receive reflected light in which the illumination light irradiated from the light source unit LS is reflected from the upper surface 122S of the plate 122. For example, the light receiving unit PD may be a photodiode.

The plurality of optical sensors S1, S2, S3, S4, S5, S6, S7, and S8 are disposed such that the separation distances from the edge 2003 of the body part BDA are sequentially increased, and may thus be used to sense the first area AR1 in contact with the upper surface 122S of the plate 122 and the second area AR2 not in contact with the upper surface 122S of the plate 122. In detail, it can be appreciated that the optical sensors S7 and S8 in which the reflected light is received by the light receiving unit PD may be disposed in the first area AR1 in contact with the upper surface 122S of the plate 122, and the optical sensors S1, S2, S3, S4, S5, and S6 in which the reflected light is not received by the light receiving unit PD are disposed in the second area AR2 not in contact with the upper surface 122S of the plate 122.

Figure 18:
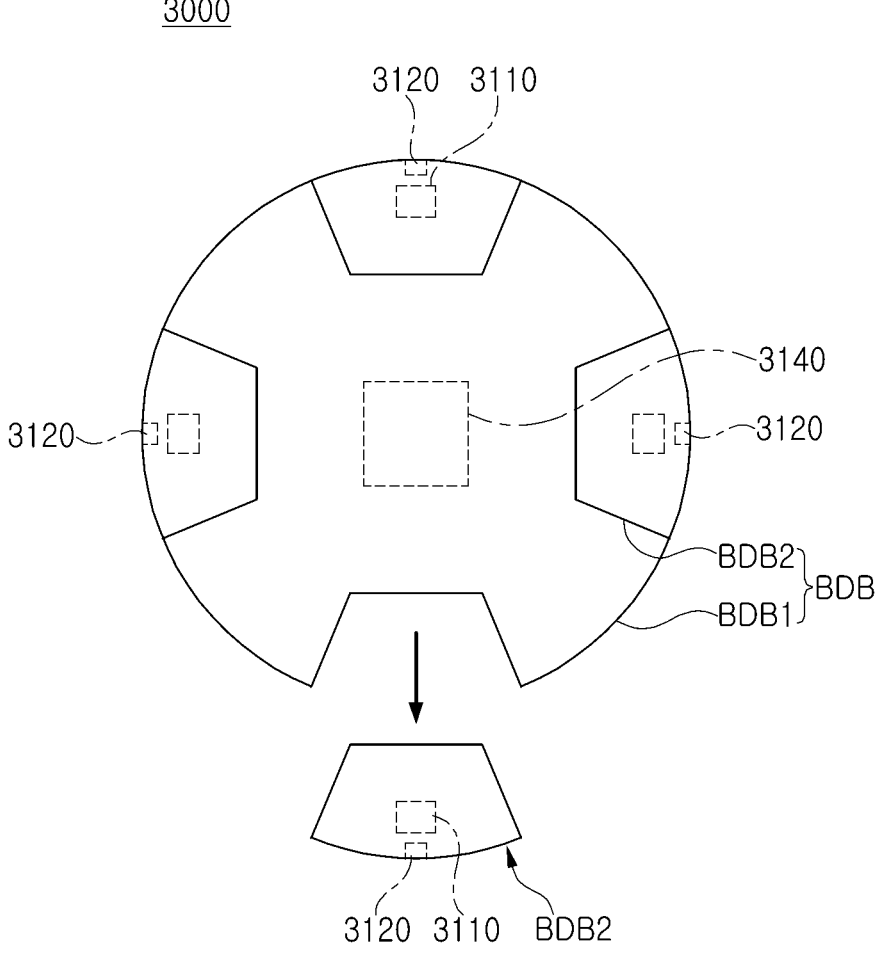
FIG. 18 is a top plan view of a sensor module according to an example embodiment.

Referring to FIG. 18, a sensor module according to an example embodiment will be described. FIG. 18 is a plan view of a sensor module according to an example embodiment as viewed from above.

Referring to FIG. 18, a sensor module 3000 according to an example embodiment may include a body part or body BDB and a plurality of sensor units or sensor sets 3110 and 3120. The body part BDB may include a first body part BDB1 and a second body part BDB2 detachably coupled to the first body part BDB1. The plurality of sensor units 3110 and 3120 may be mounted on the second body part BDB2.

Accordingly, in a case in which some of the sensor units are defective, only the second body part BDB2 on which the defective sensor unit is mounted may be selectively replaced. The plurality of sensor units 3110 and 3120 may include first sensor units 3110 and second sensor units 3120. Since the first sensor units 3110 and the second sensor units 3120 have the same configuration as the first sensor units 1110 and the second sensor units 1120 of the sensor module 1000 of the above-described embodiment, a detailed description will be omitted in the interest of brevity. A circuit unit or control circuit 3140 may transmit the measurement data transmitted from the first sensor units 3110 and the second sensor units 3120 to the control unit 700.

Figure 19:
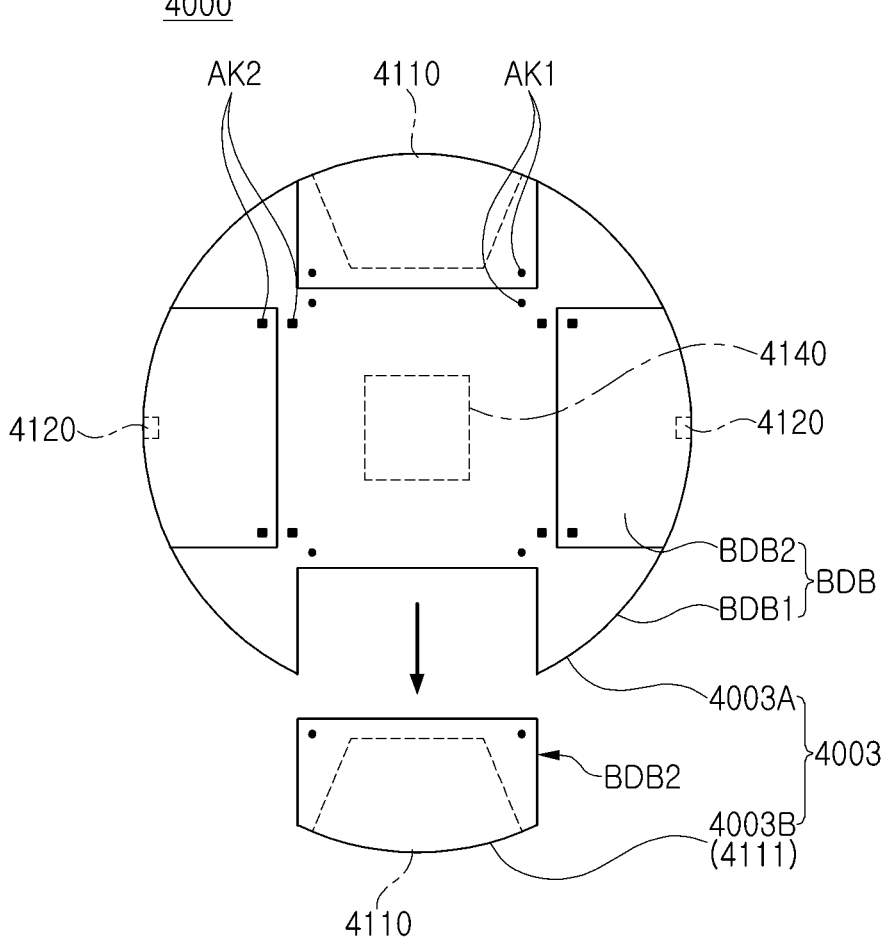
FIG. 19 is a top plan view of a sensor module according to an example embodiment.

Referring to FIG. 19, a sensor module according to an example embodiment will be described. FIG. 19 is a plan view of a sensor module according to an example embodiment as viewed from above.

Referring to FIG. 19, a sensor module 4000 according to an example embodiment may include a body part or body BDB and a plurality of sensor units or sensor sets 4110 and 4120. The body part BDB may include a first body part BDB1 and a second body part BDB2 detachably coupled to the first body part BDB1. Accordingly, when some of the sensor units are defective, only the second body part BDB2 on which the defective sensor unit is mounted may be selectively replaced. The plurality of sensor units 4110 and 4120 may include first sensor units 4110 and second sensor units 4120. In addition, alignment keys AK1 and AK2 corresponding to each other are disposed on the first body part BDB1 and the second body part BDB2, to more easily identify targets to be coupled to each other. Also, the first sensor unit 4110 may be a capacitive sensor. The edge of the first sensor unit 4110 may have the same arc shape as the edge of the second body part BDB2. Accordingly, the edge 122E of the upper surface 122S of the plate 122 on which the sensor module 4000 is seated may be effectively detected (see FIG. 11).

Figure 20:
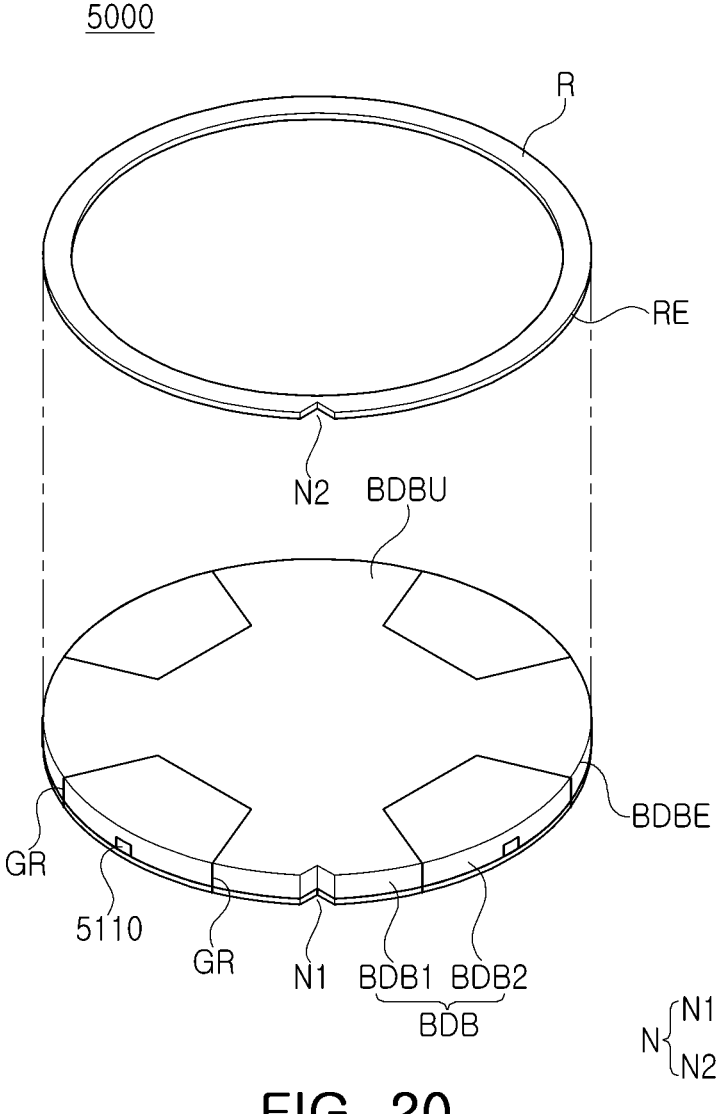
FIG. 20 is a partially exploded perspective view of a sensor module according to an example embodiment.

Referring to FIG. 20, a sensor module according to an example embodiment will be described. FIG. 20 is a partially exploded perspective view of a sensor module according to an example embodiment.

Referring to FIG. 20, a sensor module 5000 according to an example embodiment may include a body part or body BDB and a ring-shaped member R coupled to an upper surface BDBU of the body part BDB. However, the present inventive concept is not limited thereto, and according to example embodiments, the ring-shaped member R may be coupled to a lower surface of the body part BDB. The body part BDB may include a first body part BDB1 and a second body part BDB2 detachably coupled to the first body part BDB1. The sensor module 5000 may have a notch N formed in an edge thereof. In some embodiments, the notch N may have a structure in which a first notch N1 and a second notch N2 overlap. For example, the first notch N1 may be formed in an edge BDBE of the body part BDB, and the second notch N2 may be formed in an edge RE of the ring-shaped member R.

Referring to FIG. 2, in the process of seating the substrate W on the electrostatic chuck 120 in the processing module 100, a notch is formed in a portion of the edge of the substrate to check the directionality of the substrate W, and the notch is detected through an optical sensor (not illustrated). In the case in which a groove having a shape similar to a notch is formed on the side surface of the substrate W, the optical sensor may malfunction, causing a problem of detecting the groove as a notch.

Since the second body part BDB2 of an example embodiment is detachably coupled to the first body part BDB1, a fine groove GR may be formed in a portion where the first body part BDB1 and the second body part BDB2 are coupled or interface. In the sensor module 5000 of an example embodiment, by disposing the ring-shaped member R to cover the edge BDBE of the body part BDB, malfunction of the optical sensor by the groove GR that may be formed in the body part BDB may be prevented.

Figure 21:
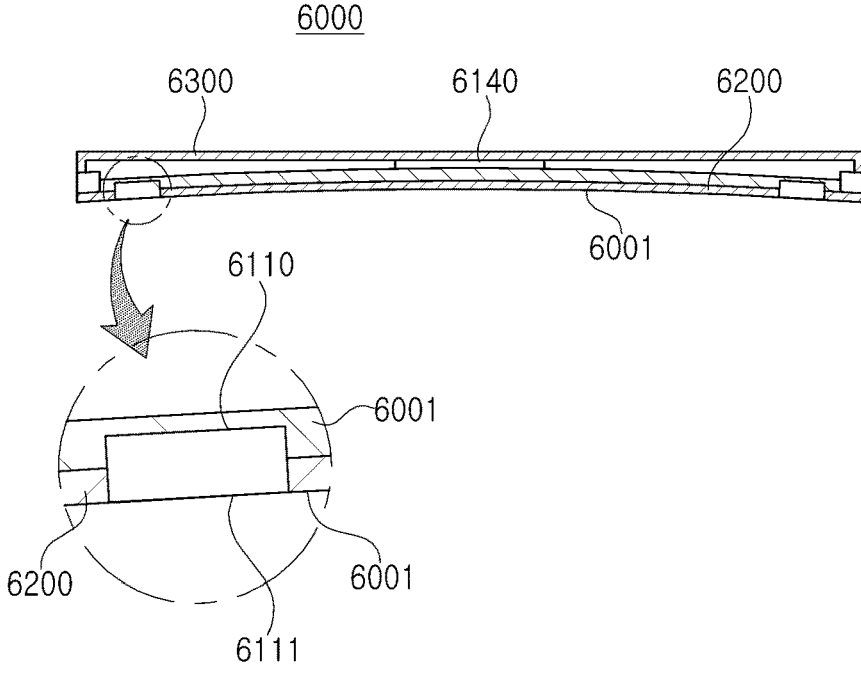
FIG. 21 is a cross-sectional view of a sensor module according to an example embodiment.

Referring to FIG. 21, a sensor module according to an example embodiment will be described. FIG. 21 is a cross-sectional view of a sensor module according to an example embodiment.

Referring to FIG. 21, in a sensor module 6000 according to an example embodiment, a lower surface 6001 may be concave. A lower surface 6111 of a first sensor unit 6110 may be inclined to correspond to the lower surface 6001 of the sensor module 6000 formed concavely. When the lower surface 6001 of the sensor module 6000 is concave, even in the case in which the upper surface 122S of the plate 122 on which the sensor module 6000 is seated is not perfectly flat, the lower surface 6111 of the first sensor unit 6110 may be in line contact with the upper surface 122S of the plate 122. Accordingly, the edge 122E of the upper surface 122S of the plate 122 on which the sensor module 6000 is seated may be effectively detected (refer to FIG. 11).

Figure 22:
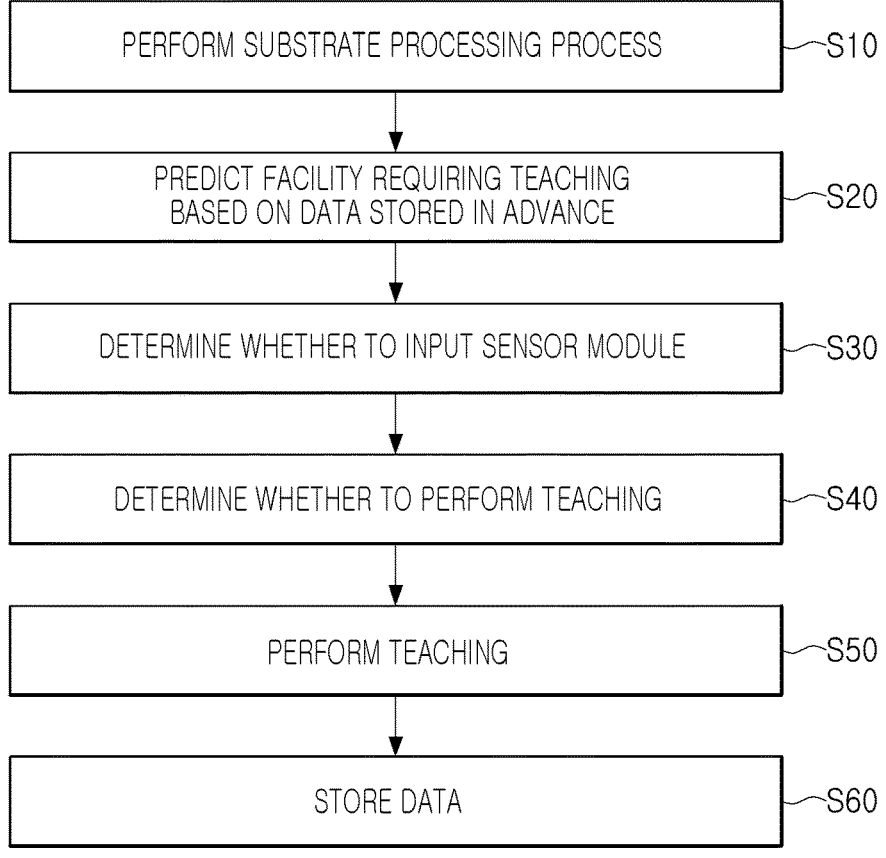
FIG. 22 is a flowchart of a substrate alignment method according to an example embodiment.
Figure 23:
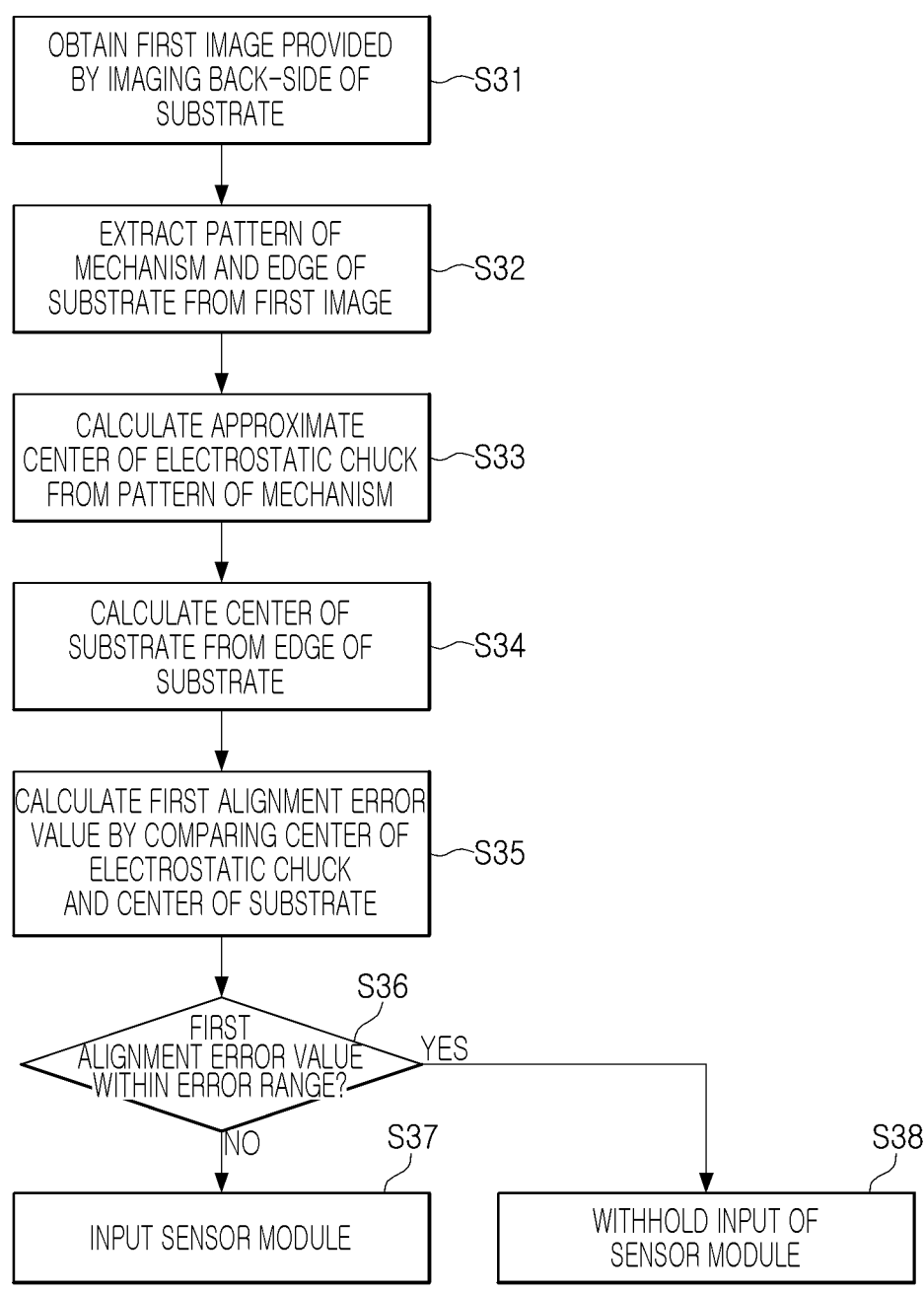
FIG. 23 is a flowchart illustrating operation S30 of FIG. 22 in detail.
Figure 24:
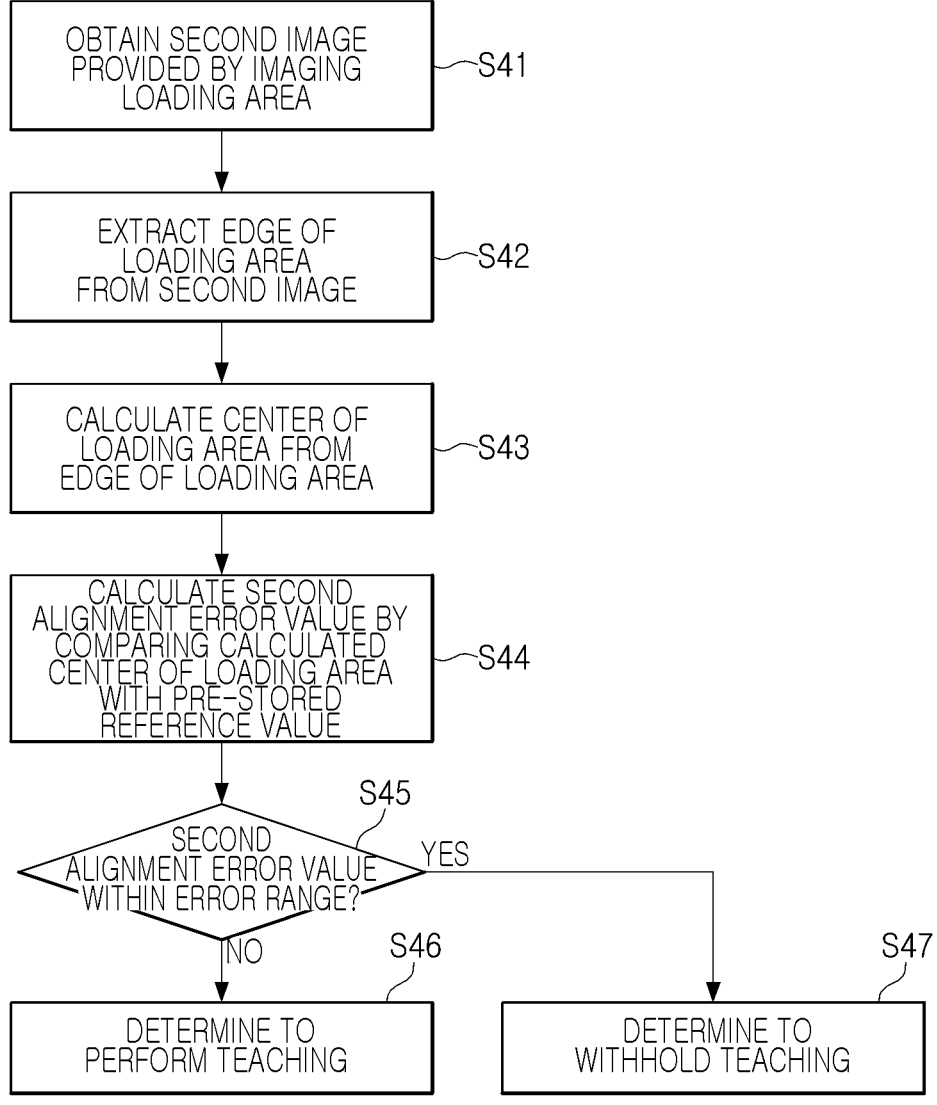
FIG. 24 is a flowchart illustrating operation S40 of FIG. 22 in detail.

Next, a substrate alignment method according to an example embodiment will be described with reference to FIGS. 22 to 24. FIG. 22 is a flowchart of a substrate alignment method according to an example embodiment. FIG. 23 is a flowchart illustrating operation S30 of FIG. 22 in detail, and FIG. 24 is a flowchart illustrating operation S40 of FIG. 22 in detail.

The substrate alignment method according to an example embodiment may be performed in the substrate processing apparatus illustrated in FIGS. 1 to 3. Previously, since each configuration of the substrate processing apparatus has been specifically described, detailed description of each configuration of the substrate processing apparatus may be omitted to prevent overlapping descriptions in the interest of brevity.

Referring to FIG. 22, first, the control unit 700 may load a substrate W into a loading area within the processing module 100 and perform a substrate processing process (S10). In some embodiments, the loading area may be an upper surface of the electrostatic chuck 120. According to an example embodiment, before loading the substrate W into the processing module 100, the control unit 700 may acquire the first reference image RF_IMG1 obtained by capturing the lower surface W1 of the substrate W. The control unit 700 may predict a facility that requires teaching due to a positional deviation of the center of the substrate W based on the data of the database stored in advance (S20).

For example, when there are a plurality of substrate processing apparatuses 10, the control unit 700 predicts the substrate processing apparatus 10 that will require teaching due to deviation occurring, or may predict the processing module 100 that needs to be taught in the substrate processing apparatuses 10. This prediction may be performed by applying machine learning to data stored in a database. However, depending on an example embodiment, the operation of predicting a facility in which an abnormality will occur may be omitted.

Next, referring to FIGS. 22 and 23, the control unit 700 may determine whether to input the sensor module 1000 (S30). Referring to FIG. 23, a process of determining whether to bring in the sensor module 1000 will be described in detail. In detail, the control unit 700 obtains a first image IMG1 obtained by imaging the lower surface W1 of the substrate W using the imaging unit 423 (S31), and may extract the pattern of the mechanism and the edge of the substrate W from the first image IMG1 (S32). The control unit 700 may calculate a position value of an approximate center C2 of the loading area (e.g., the electrostatic chuck) from the pattern of the mechanism (S33). The control unit 700 may calculate the center of the substrate W from the edge of the substrate W (S34). According to an example embodiment, the operations S33 and S34 may be performed in a different order or may be performed substantially simultaneously. According to an example embodiment, as the control unit 700 compares the previously acquired first reference image (RF_IMG1) with the first image (IMG1), an operation of deleting a pattern formed in a previous substrate processing process from the first image IMG1 may be further performed.

The control unit 700 compares the position value of the approximate center C2 of the loading area with the center of the substrate W, and may calculate a first alignment error value that is a deviation between the approximate center C2 of the loading area and the center of the substrate W (S35). Next, the control unit 700 may determine whether the first alignment error value is within an error range (S36). When the first alignment error value is not within the error range (No), for example, when the first alignment error value exceeds the error range, the control unit 700 may determine to input the sensor module 1000 into the processing module 100 (S37). Next, the control unit 700 may determine whether to perform teaching (S40), perform teaching (S50), and perform a subsequent operation of storing data (S60).

On the other hand, when the first alignment error value is within the error range (Yes), the control unit 700 may determine to withhold input of the sensor module 1000 into the processing module 100 (S38). In this case, the control unit 700 may perform only the subsequent operation of converting the data into a database and storing the data (S60).

Next, with reference to FIGS. 22 and 24, the operation of determining whether to perform the teaching (S40) will be described. First, the control unit 700 may bring the sensor module 1000 into the processing module 100 and obtain a second image IMG2 obtained by capturing the upper surface 122S of the plate 122 that is the loading area (S41). The control unit 700 may extract the edge 122E of the upper surface 122S of the plate 122 from the second image IMG2 (S42). The control unit 700 may calculate a position value of the center of the upper surface 122S of the plate 122 from the extracted edge 122E (S43). The control unit 700 may calculate a second alignment error value, which is a deviation between the center C2 of the plate 122 and the center of the substrate W by comparing the calculated center position value with the pre-stored reference value (S44). When the second alignment error value is not within the error range (No), for example, when the second alignment error value exceeds the error range, the control unit 700 may determine to perform teaching (S46). On the other hand, when the second alignment error value is within the error range (Yes), the control unit 700 may determine to suspend or withhold teaching (S47).

As set forth above, the sensor module according to an example embodiment may be used to predict the timing of teaching the transfer robot.

The substrate processing apparatus according to an example embodiment may predict the timing of teaching the transfer robot, and based thereon, perform teaching of the transfer robot in real time, thereby teaching the transfer robot without stopping the equipment.

While example embodiments have been illustrated and described above, it will be apparent to those skilled in the art that modifications and variations could be made without departing from the scope of the present inventive concept as defined by the appended claims.

What is claimed is:

1. A substrate processing apparatus comprising:
a chamber defining an internal space in which processing a substrate is performed;
an electrostatic chuck inside the chamber and including a loading area surrounded by a sidewall;
a sensor module configured to be loaded into the loading area of the electrostatic chuck and to output measurement data including a first measurement value obtained by detecting an area of the sensor module in contact with the loading area and a second measurement value obtained by detecting a separation distance from the sidewall;
an imaging unit configured to output a third measurement value including an identification of one or more particle patterns formed on a lower surface of the substrate during processing of the substrate;
a transfer robot configured to load the sensor module to a reference position of the loading area; and
a controller configured to:
calculate a first error value between a center of the loading area and a center of the substrate based on the third measurement value to determine a point in time at which the sensor module is to be brought into the internal space;
calculate a second error value between a center of the sensor module and the reference position based on the first measurement value and the second measurement value that are output from the sensor module; and
calibrate or control the transfer robot to correct the second error value.

2. The substrate processing apparatus of claim 1, wherein the sensor module includes, a body including a first cover plate and a second cover plate;

a plurality of first sensor units on a lower surface of the body and configured to output the first measurement value;

a plurality of second sensor units disposed along a side surface of the body and configured to output the second measurement value; and a control circuit embedded in the body and configured to control the plurality of first sensor units and the plurality of second sensor units and to generate the measurement data based on the first measurement value and the second measurement value, wherein the body has a circumference corresponding to that of a semiconductor wafer.

3. The substrate processing apparatus of claim 2, wherein the plurality of first sensor units include an image sensor, wherein the image sensor is configured to capture an image of the loading area and to output the image as the first measurement value.

4. The substrate processing apparatus of claim 2, wherein the plurality of first sensor units include a capacitive sensor, wherein the capacitive sensor is configured to output a capacitance change value of the loading area as the first measurement value.

5. The substrate processing apparatus of claim 2, wherein the plurality of first sensor units include a plurality of optical sensors, wherein the plurality of optical sensors are disposed in a sequence to be increasingly spaced apart from an edge of the body.

6. The substrate processing apparatus of claim 5, wherein each of the plurality of optical sensors includes a light source unit and a light receiving unit, wherein the light source unit is configured to irradiate illumination light to the loading area, and the light receiving unit is configured to receive reflected light from the illumination light reflected from the loading area and to output the received reflected light as the first measurement value.

7. The substrate processing apparatus of claim 2, further comprising a third sensor unit on an upper surface of the body and configured to capture an image of an upper part of the body and output the captured image as a fourth measurement value.

8. The substrate processing apparatus of claim 7, wherein the controller is configured to control the transfer robot, to align a hand of the transfer robot on the reference position of the loading area, and to control the third sensor unit of the sensor module to capture an image of a lower surface of the hand.

9. A substrate processing apparatus comprising:

a chamber including an internal space in which a substrate processing process of a substrate is performed;

a substrate support unit in the internal space and including a loading area on which a lower surface of the substrate is configured to be seated and wherein a mechanism is disposed on the loading area and wherein the loading area is surrounded by a sidewall;

an imaging unit configured to generate first measurement data by imaging the lower surface of the substrate on which the substrate processing process has been performed;

a sensor module configured to be carried into the internal space and seated in the loading area, and configured to output second measurement data including a first measurement value obtained by detecting an area of the sensor module in contact with the loading area and a second measurement value obtained by detecting a separation distance from the sidewall;

a transfer robot configured to load and unload the sensor module and the substrate into and from the internal space; and a control unit configured to identify, in the first measurement data, particle patterns of which formed when an arrangement of the mechanism is transferred onto the lower surface of the substrate during the substrate processing process and an edge of the substrate, to calculate a first alignment error value that is a deviation between a rough center of the loading area and a center of the substrate based on the particle patterns and the edge of the substrate, respectively, to determine a point in time at which the sensor module should be brought into the internal space based on the first alignment error value, to detect an edge of the loading area based on the second measurement data, to calculate a second alignment error value of the substrate by comparing the edge of the loading area with a reference position value, and to calibrate or teach the transfer robot to correct the second alignment error value.

10. The substrate processing apparatus of claim 9, wherein the substrate support unit includes an electrostatic chuck, and the sensor module is configured to sense an upper surface of the electrostatic chuck.

11. The substrate processing apparatus of claim 9, wherein the sensor module includes, a body part;

a plurality of first sensor units on a lower surface of the body part and configured to output the first measurement value;

a plurality of second sensor units disposed along a side surface of the body part and configured to output the second measurement value; and a circuit unit embedded in the body part and configured to control the plurality of first sensor units and the plurality of second sensor units, and to generate the second measurement data based on the first measurement value and the second measurement value.

12. The substrate processing apparatus of claim 9, wherein the sensor module has the same shape as a shape of the substrate, and a thickness of the sensor module is 5 mm or less.

\* \* \* \* \*